(12) United States Patent
Lee et al.

(10) Patent No.: US 12,713,952 B2
(45) Date of Patent: Aug. 18, 2026

(54) ELECTRONIC DEVICES AND METHODS OF MANUFACTURING ELECTRONIC DEVICES

(71) Applicant: Amkor Technology Singapore Holding Pte. Ltd., Singapore (SG)

(72) Inventors: Wang Gu Lee, Seoul (KR); Ju Hong Shin, Seoul (KR); Ji Hun Lee, Gyeonggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 527 days.

(21) Appl. No.: 18/139,896

(22) Filed: Apr. 26, 2023

(65) Prior Publication Data

US 2024/0363566 A1 Oct. 31, 2024

(51) Int. Cl.

| | |
|---|---|
| ***H10W 70/685*** | (2026.01) |
| ***H10W 70/05*** | (2026.01) |
| ***H10W 74/10*** | (2026.01) |
| *H10W 70/69* | (2026.01) |
| *H10W 72/00* | (2026.01) |
| *H10W 72/90* | (2026.01) |
| *H10W 80/00* | (2026.01) |
| *H10W 90/00* | (2026.01) |

(52) U.S. Cl.

CPC ......... *H10W 70/685* (2026.01); *H10W 70/05* (2026.01); *H10W 74/117* (2026.01); *H10W 70/69* (2026.01); *H10W 72/01935* (2026.01); *H10W 72/01938* (2026.01); *H10W 72/01951* (2026.01); *H10W 72/07236* (2026.01); *H10W 72/90* (2026.01); *H10W 72/923* (2026.01); *H10W 72/934* (2026.01); *H10W 72/941* (2026.01); *H10W 72/9415* (2026.01); *H10W 72/942* (2026.01); *H10W 72/951* (2026.01); *H10W 72/952* (2026.01); *H10W 80/016* (2026.01); *H10W 80/301* (2026.01); *H10W 80/327* (2026.01); *H10W 80/334* (2026.01); *H10W 90/792* (2026.01); *H10W 90/794* (2026.01)

(58) Field of Classification Search

None

See application file for complete search history.

(56) References Cited

U.S. PATENT DOCUMENTS

2006/0281363 A1* 12/2006 Trezza .................... H01L 24/75 257/E21.597
2016/0049384 A1* 2/2016 Lu .......................... H10D 88/00 257/737
2022/0181299 A1* 6/2022 Kim ........................ H01L 21/78

* cited by examiner

*Primary Examiner* — Hung K Vu

(74) *Attorney, Agent, or Firm* — Spectrum IP Law Group LLC

(57) ABSTRACT

In one example, an electronic device, comprises a first component comprising a first component inner side and a first component backside, a first component inner terminal, a first component dielectric at the first component inner side, and a first component interconnect coupled with the first component inner terminal. The electronic device comprises a second component over the first component and comprising a second component inner side facing the first component inner side, and a second component backside, a second component inner terminal, a second component dielectric at the second component inner side, and a second component interconnect coupled with the second component inner terminal. The first component dielectric and the second component dielectric comprise an inorganic material, the first component dielectric is coupled with the second component dielectric, and the first component interconnect is coupled with the second component interconnect. Other examples and related methods are also disclosed herein.

18 Claims, 32 Drawing Sheets

1014
1013
1016
1012
101
1011

1014
1013
1016
1012
101
1011

2014
2012
2016
2012i
2021o
2011
201

2014
2012
2016
2012i
2021o
2011
201

2014
2012
2012i
2021o
2015
2017
2016
2011
201

1015
1016
1017
1013
1014
1012
1011
101
2012o
2012i
2017
2016
2015
2011
201

401
401b
401a
4011
1013
1012
1011
101

401
401b
401a
4011
1014
1013
1012
1011
101

1014
1013
6015
602
603
1014a
101
1012
1011

1014
1013
602
6015
1014a
601
101
1012
1011

ELECTRONIC DEVICES AND METHODS OF MANUFACTURING ELECTRONIC DEVICES

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
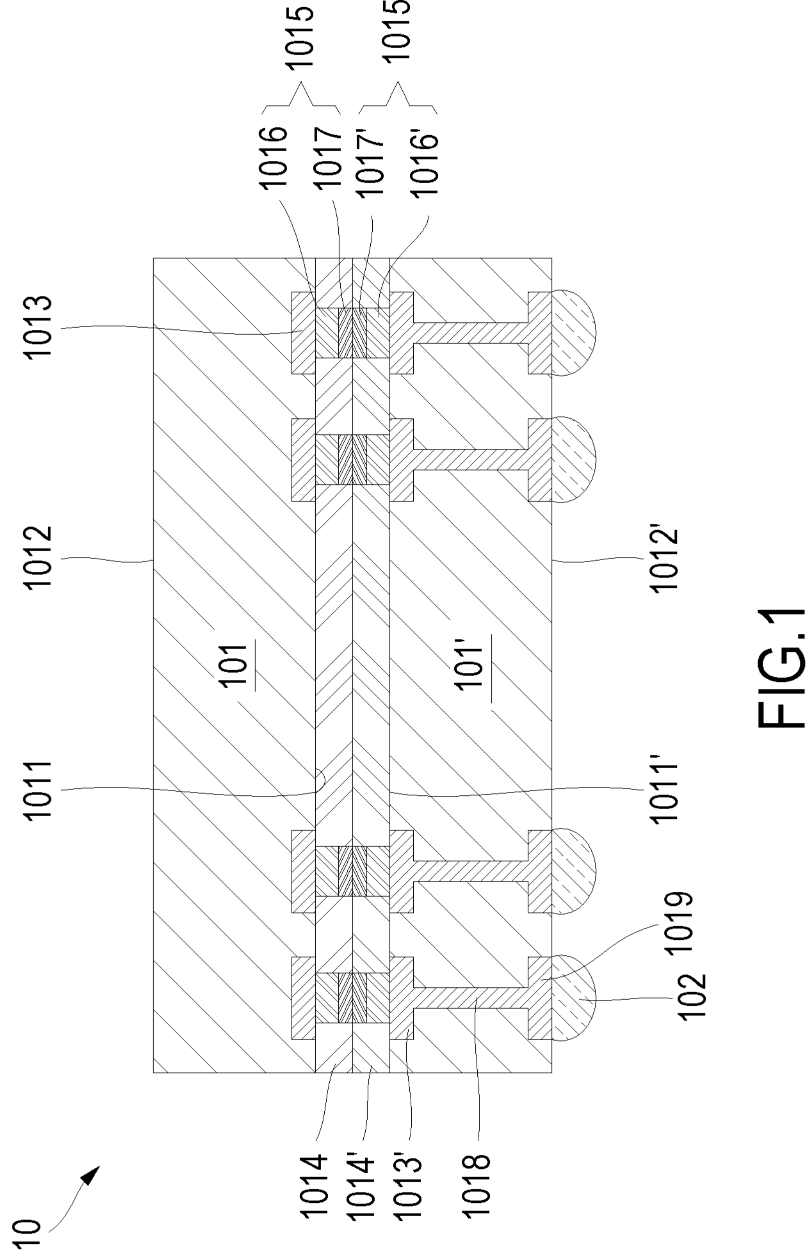
FIG. 1 shows a cross-sectional view of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques can be omitted to avoid unnecessarily obscuring the present disclosure. In addition, elements in the drawing figures are not necessarily drawn to scale. For example, the dimensions of some of the elements in the figures can be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including" are "open ended" terms and specify the presence of stated features, but do not preclude the presence or addition of one or more other features. The terms "first," "second," "third," etc. can be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" can be used to describe two elements directly contacting each other or describe two elements indirectly coupled by one or more other elements. For example, if element A is coupled to element B, then element A can be directly contacting element B or indirectly coupled to element B by an intervening element C. As used herein, the term "coupled" can refer to an electrical coupling or a mechanical coupling. The terms "over" or "on" can be used to describe two elements directly contacting each other or describe two elements indirectly coupled by one or more other elements.

DESCRIPTION

In a one example, an electronic device, comprises a first component comprising a first component inner side and a first component backside, a first component inner terminal, a first component dielectric at the first component inner side, and a first component interconnect coupled with the first component inner terminal. The electronic device comprises a second component over the first component and comprising a second component inner side facing the first component inner side, and a second component backside, a second component inner terminal, a second component dielectric at the second component inner side, and a second component interconnect coupled with the second component inner terminal. The first component dielectric and the second component dielectric comprise an inorganic material, the first component dielectric is coupled with the second component dielectric, and the first component interconnect is coupled with the second component interconnect. Other examples and related methods are also disclosed herein.

In another example, a method to manufacture an electronic device comprises providing a first component comprising a first component inner side, a first component backside, a first component inner terminal, a first component dielectric at the first component inner side, and a first component interconnect coupled with the first component inner terminal, providing a second component over the first component and comprising a second component inner side facing the first component inner side, and a second component backside, a second component inner terminal at the second component inner side, a second component dielectric adjacent to the second component inner side, and a second component interconnect coupled with the second component inner terminal, and bonding the first component with the second component, wherein the first component dielectric is bonded with the second component dielectric, and the first component interconnect is bonded with the second component interconnect.

Other examples are included in the present disclosure. Such examples can be found in the figures, in the claims, or in the description of the present disclosure.

FIG. 1 shows a cross-sectional view of an example electronic device 10. In the example shown in FIG. 1, electronic device 10 can comprise electronic components 101 and 101' and external interconnects 102. In some examples, electronic component 101 ban be referred to as a component, and can comprise component inner side 1011 and component backside 1012. Similarly, component 101' can be referred to as a component, and can comprise component inner side 1011' and component backside 1012'. In some examples, component 101 or component 101' can comprise a substrate, a package, an electronic device, a semiconductor material, or a semiconductor chip, and the scope of the disclosed subject matter is not limited in this respect. Electronic component 101 can comprise component bond pads 1013, component dielectric 1014, and component interconnects 1015. Electronic component 101' can be similar to electronic component 101. Electronic component 101' can comprise component bond pads 1013', which can be similar to bond pads 1013, component dielectric 1014', which can be similar to component dielectric 1014, and component interconnects 1015', which can be similar to component interconnects 1015. Component interconnects 1015 and 1015' can be coupled with component bond pads 1013 and 1013', or component inner terminals, respectively. Component dielectrics 1014 and 1014' can be at component inner side 1011 and component inner side 1011', respectively. In some examples, component bond pads 1013 and component bond pads 1013' can be referred to as component inner terminals. In some examples, electronic component 101' can also comprise vertical interconnects 1018 and backside conductive layer 1019. In some examples, electronic component 101' can comprise a semiconductor chip. In some examples, vertical interconnects can be extended through electronic component 101' and can be coupled with component bond pads 1013', or component inner terminals. Component interconnects 1015 and 1015' can comprise interconnect first-portions 1016 and 1016', respectively, and interconnect second-portions 1017 and 1017', respectively. In some examples, interconnect first-portions 1016 and 1016' can comprise a different material than the material of interconnect second-portions 1017 and 1017'. In some examples, as discussed in further detail herein, component dielectrics 1014 and 1014' can comprise an organic material, an inorganic material, or a combination of an inorganic material and an organic material. In some examples, component dielectric 1017 can be coupled with component dielectric 1017'. In some examples, component interconnect 1014 can be coupled with component interconnect 1015'.

Figures 2A, 2B:
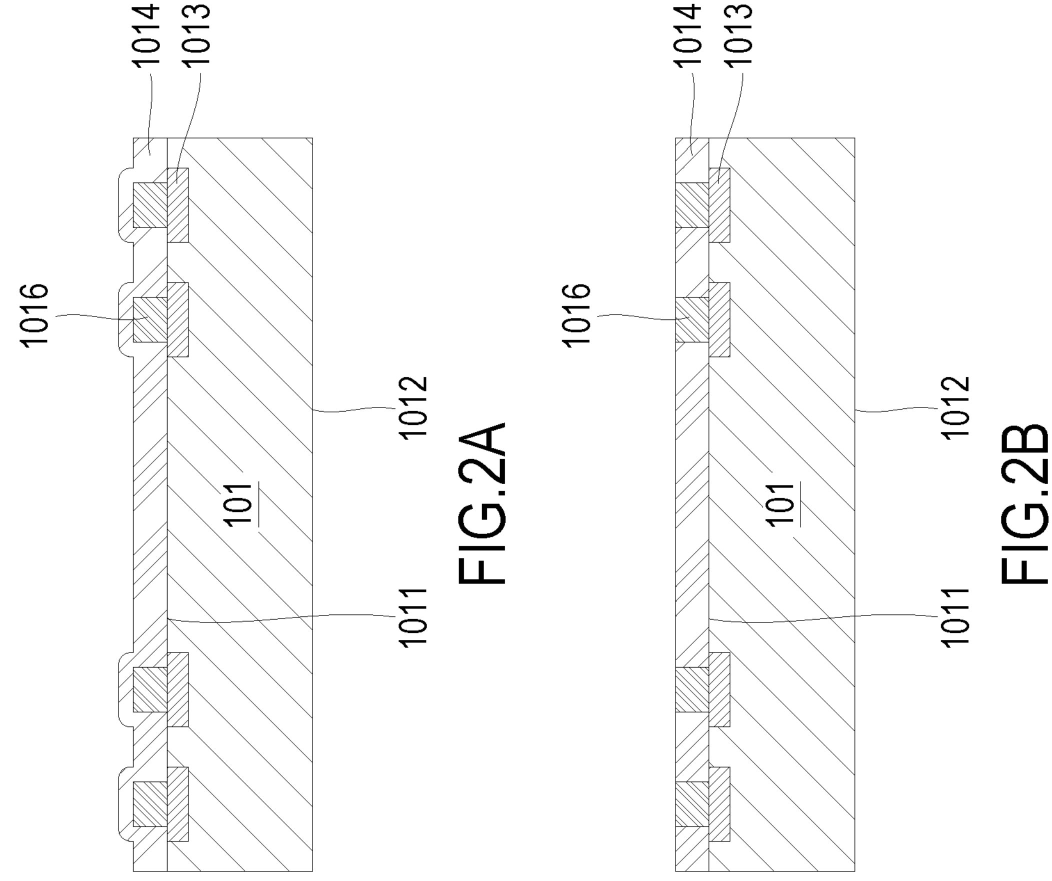
FIGS. 2A-2E show cross-sectional views of an example method for manufacturing an example electronic device.

FIGS. 2A to 2E show cross-sectional views of an example method for manufacturing an example electronic device. FIG. 2A shows a cross section view of electronic device 10 at an early stage of manufacture. In the example shown in FIG. 2A, interconnect first-portions 1016 and component dielectric 1014 comprising one or more dielectric layers can be provided on electronic component 101. Electronic component 101 includes component inner side 1011 and component backside 1012 opposite component inner side 1011. Electronic component 101 can comprise component bond pads 1013 positioned over component inner side 1011. In some examples, component inner side 1011 can comprise or be referred to as a component active side. Component bond pads 1013 can spaced apart from each other in the row or column direction over component inner side 1011. Component bond pads 1013 can comprise or be referred to as lands, conductive pads, contact pads, pads, or under bump metallization (UBM). Component bond pads 1013 can comprise a conductive material, such as, for example, aluminum, copper, an aluminum alloy, or a copper alloy. Component bond pads 1013 can be input/output terminals of electronic component 101 or ground terminals. In some examples, the overall thickness of electronic component 101 can range from approximately 50 micrometers (μm) to approximately 800 μm, and the area or "footprint" of electronic component 101 can range from approximately 0.5 millimeters (mm)×0.5 mm to approximately 70 mm×70 mm.

Interconnect first-portions 1016 can be provided on component bond pads 1013 of electronic component 101. Interconnect first-portions 1016 can be copper posts or copper pillars. In some examples, interconnect first-portions 1016 can be provided by electroplating, electroless plating, sputtering, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, after providing a photoresist pattern exposing component bond pads 1013 of electronic component 101, interconnect first-portions 1016 can be provided to cover exposed component bond pads 1013. Interconnect first-portions 1016 are coupled to component bond pads 1013. In some examples, interconnect first portions 1016 can contact component bond pads 1013 of electronic component 101.

Component dielectric 1014 can be provided over component inner side 1011 and interconnect first-portions 1016 of electronic component 101. In some examples, component dielectric 1014 can be provided to cover component inner side 1011 of electronic component 101 and to cover the upper sides, which are the sides opposite, or distal to, component inner side 1011, and sidewalls, or lateral sides, of interconnect first-portions 1016. In some examples, component dielectric 1014 can be formed by deposition or coating. In some examples, component dielectric 1014 can comprise or be referred to as a component inorganic dielectric, a component oxide film, or a component nitride film. For example, component dielectric 1014 can comprise silicon oxide ($SiO_2$), silicon carbon nitride (SiCN), or silicon nitride (SiN).

FIG. 2B shows a cross section view of electronic device 10 at a later stage of manufacture. In the example shown in FIG. 2B, an upper portion of component dielectric 1014 can be removed and the upper sides of interconnect first-portions 1016 can be exposed from component dielectric 1014. In some examples, the upper portion of component dielectric 1014 can be removed by grinding or chemical mechanical planarization (CMP), also referred to as chemical mechanical polishing. In some examples, the upper side of component dielectric 1014 and the upper sides of interconnect first-portions 1016 can be coplanar. For example, the thickness of component dielectric 1014 can be similar to the thickness of interconnect first-portions 1016. In some examples, the thickness of interconnect first-portions 1016 can range from approximately 1 μm to approximately 20 μm, approximately 1 μm to approximately 10 μm, or approximately 1 μm to approximately 5 μm. The pitch of interconnect first-portions 1016 can range from approximately 1 μm to approximately 100 μm.

Figures 1, 2C:
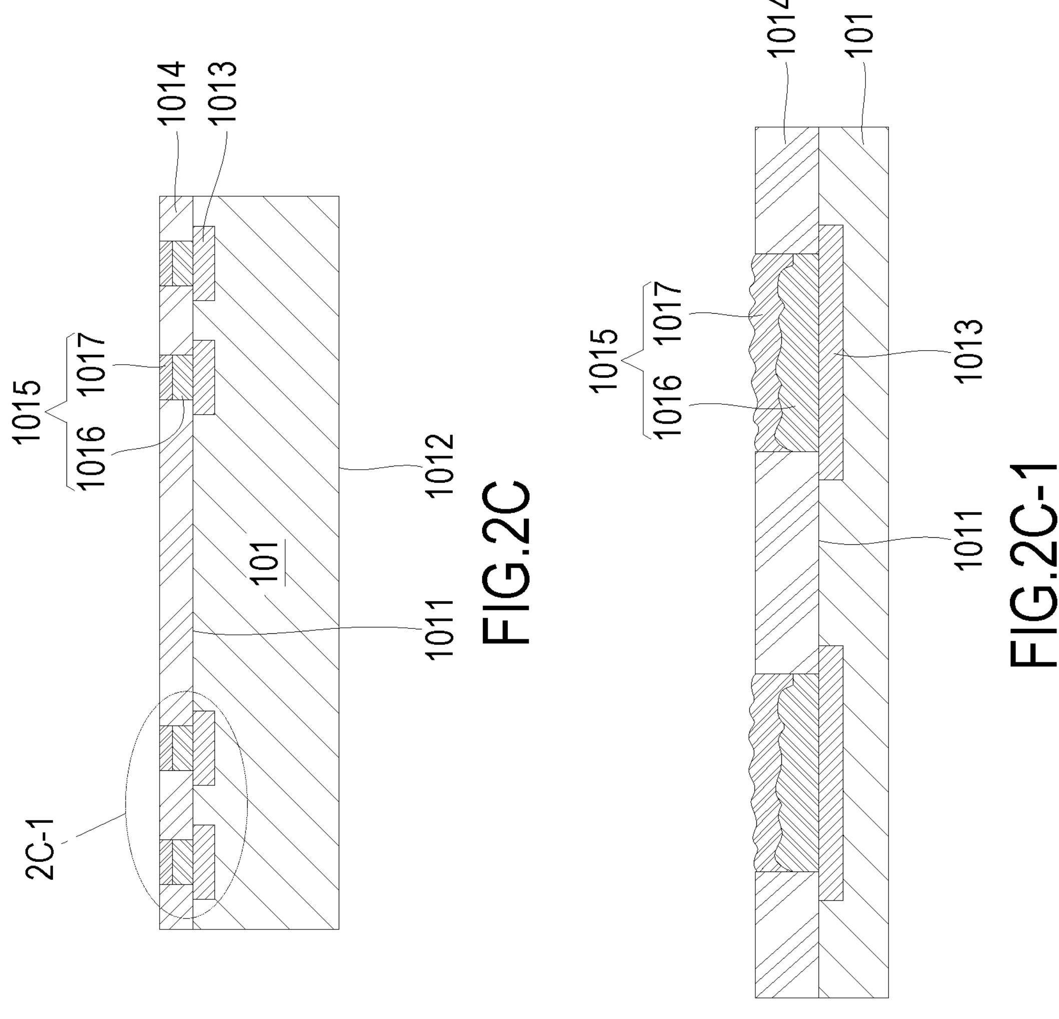

FIG. 2C shows a cross section view of electronic device 10 at a later stage of manufacture. FIG. 2C-1 shows an enlarged view of the portion of electronic device 10 shown in shown in dashed area 2C-1 in FIG. 2C. In the example shown in FIGS. 2C and 2C-1, interconnect second-portions

1017 can be provided on interconnect first-portions 1016. In some examples, interconnect second-portions 1017 can be provided by electroless plating. For example, interconnect second-portions 1017 can displace the top portions of interconnect first-portions 1016 and thus can be plated by displacement plating.

In some examples, interconnect second-portions 1017 can comprise a solder, Sn, or low melting-point material. For example, the low melting-point material can comprise one or more selected from Sn, Sn—Pb, Sn37-Pb, Sn95-Pb, Sn—Pb—Ag, Sn—Cu, Sn—Ag, Sn—Au, Sn—Bi, and Sn—Ag—Cu. For example, interconnect first-portions 1016 can be copper and interconnect second-portions 1017 can be Sn, and interconnect second-portions 1017 can be Sn can be provided by replacing the copper on the upper side of interconnect first-portions 1016 with the Sn. In some examples, the interface between interconnect first-portion 1016 and interconnect second-portion 1017 may not be planar due to displacement plating. Interconnect second-portions 1017 can be coupled to interconnect first-portions 1016. In accordance with various examples, component interconnects 1015 can comprise interconnect first-portions 1016 and interconnect second-portions 1017. The upper side of interconnect second-portions 1017 and the upper side of component dielectric 1014 can be generally coplanar; however, the upper side of interconnect second-portion 1017 can be non-planar such that portions of interconnect second-portion 1017 can be above or below the upper side of component dielectric 1014. In some examples, the thickness of interconnect second-portions 1017 can range from approximately 0.5 μm to approximately 1.5 μm. In some examples, the overall thickness of component interconnects 1015 can range from approximately 1 μm to approximately 20 μm, approximately 1 μm to approximately 10 μm, or approximately 1 μm to approximately 5 μm.

After interconnect second-portions 1017 are provided, the upper side of component dielectric 1014 be "activated" to provide hydroxyl groups on the upper side of component dielectric 1014. In some examples, the upper side of component dielectric 1014 can be cleaned and activated in a plasma chamber through atomic shock in vacuum. For example, component dielectric 1014 when the surface of component dielectric 1014 is subjected to plasma treatment, hydrogen (H) can be generated, and water provided on the surface or oxygen particles separated from the air can be bonded with hydrogen to induce hydroxyl (OH) groups on the surface. When component dielectric 1014 is subjected to plasma treatment in a state in which water or air is provided to the surface, formation of hydroxyl (OH) groups can be induced on the surface through activation. The hydroxyl (OH) groups of component dielectric 1014 can be bonded with another hydroxyl group into a new oxide film through heat treatment. After interconnect second-portions 1017 are provided, an oxide film formed by exposure to room temperature can be removed by performing plasma treatment on the upper sides of interconnect second-portions 1017.

In accordance with various embodiments, electronic component 101 can be provided by the manufacturing steps shown in FIGS. 2A to 2C. Electronic component 101 can comprise component dielectric 1014 and component interconnects 1015 positioned on component inner side 1011. It is contemplated and understood that electronic component 101' can be provided in a similar manner.

Figures 2D, 2E:
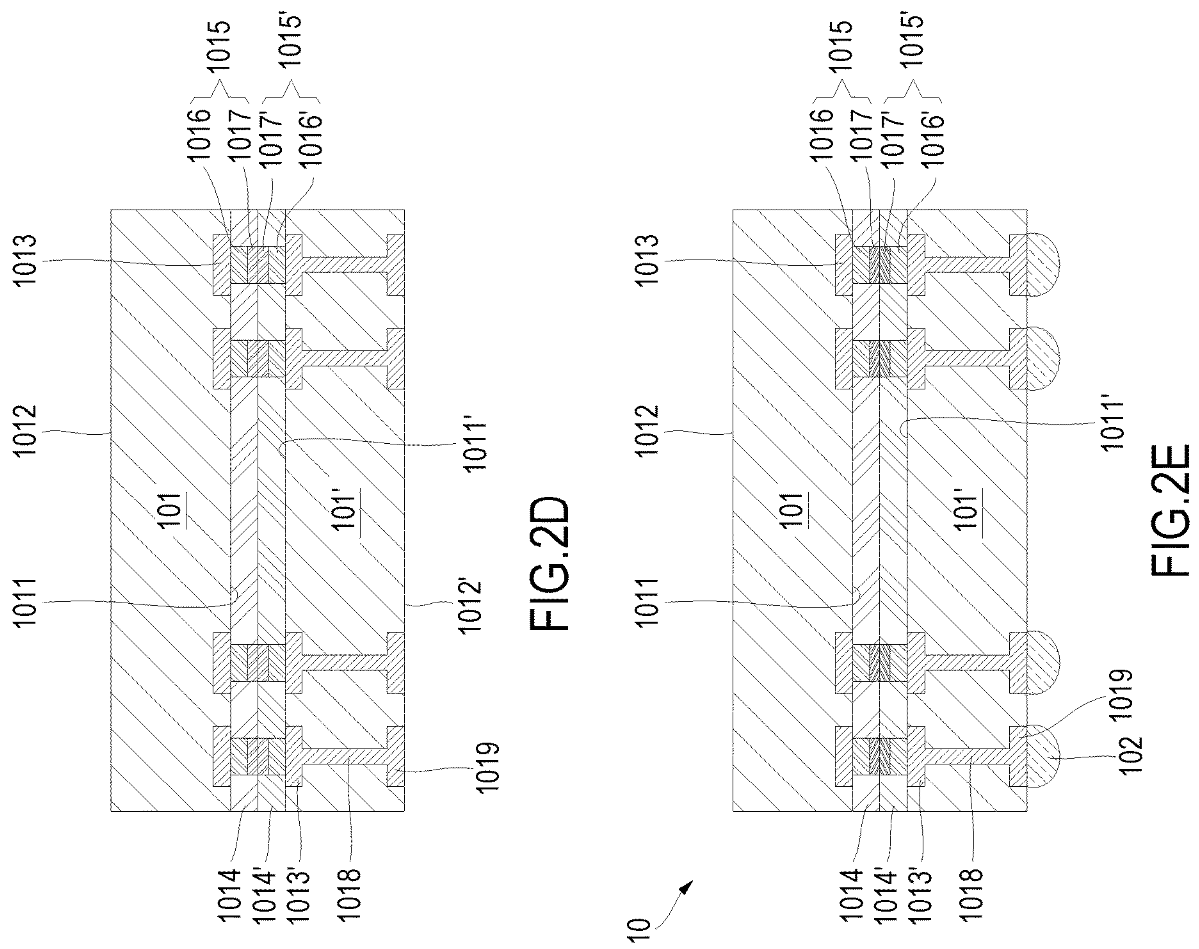

FIG. 2D shows a cross section view of electronic device 10 at a later stage of manufacture. In the example shown in FIG. 2D, component dielectric 1014 of electronic component 101 can be bonded to component dielectric 1014' of electronic component 101', and component interconnects 1015 of electronic component 101 can be bonded to component interconnects 1015' of electronic component 101'. In some examples, electronic components 101 and 101' can comprise or be referred to as one or more semiconductor dies, chips or packages. Electronic components 101 and 101' can comprise a memory, a digital signal processor (DSP), a microprocessor, a network processor, a power management processor, an audio processor, a radio-frequency (RF) circuit, a wireless baseband system-on-chip (SoC) processor, a sensor, an electrical circuit, such as application specific integrated circuit. Electronic components 101 and 101' can be the same or different type components.

Electronic component 101 can be flipped and aligned on electronic component 101' such that component dielectric 1014 is on or contacting component dielectric 1014' and component interconnects 1015' are on or contacting component interconnects 1015'. Electronic component 101 can be flipped so component inner side 1011 is oriented toward component inner side 1011'. In some examples, electronic component 101' can include corresponding elements, features, materials, or manufacturing method similar to previously described for electronic component 101 manufactured by the manufacturing process shown in FIGS. 2A to 2C. Electronic component 101' can comprise vertical interconnects 1018 and back conductive layer 1019.

Back conductive layer 1019 of electronic component 101' can be positioned on component backside 1012' of electronic component 101'. Back conductive layer 1019 can be provided to have conductive patterns spaced apart from each other in a row or column direction. In some examples, back conductive layer 1019 can comprise or be referred to as a conductive layer, a trace, a pad, a land, a redistribution layer (RDL), a wiring pattern, or a circuit pattern. In some examples, back conductive layer 1019 can include corresponding elements, features, materials, or manufacturing method similar to previously described for component bond pads 1013.

Vertical interconnects 1018 can penetrate electronic component 101' and can couple component bond pads 1013', positioned on component inner side 1011', and back conductive layer 1019, positioned on component backside 1012'. In some examples, vertical interconnects 1018 can comprise or be referred to as through vias, through silicon via (TSV), conductive posts, conductive pillars, or conductive vias. Vertical interconnects 1018 can comprise copper, gold, silver, nickel, or other conductive material.

In some examples, pick-and-place equipment can pick up electronic component 101 and place electronic component 101 on electronic component 101'. In some examples, electronic component 101 and electronic component 101' can be in wafer form. In some examples, electronic component 101 or electronic component 101' can be in chip form by being singulated, and the other of electronic component 101 and electronic component 101' can be in wafer form. In some examples, electronic component 101 and electronic component 101' can be in chip form.

In accordance with various examples, component dielectric 1014 of electronic component 101 is then bonded to component dielectric 1014' of electronic component 101'. For example, the activated upper side of component dielectric 1014 of electronic component 101 bonds to the activated side of component dielectric 1014' of electronic component 101'. Component dielectric 1014 and component dielectric 1014' can bond to one another at a relatively low temperature, for example a temperature of 150° C. or less. As component dielectric 1014 bonds to component dielectric 1014', interconnect second-portions 1017 contacts interconnect second-portions 1017'. The bonding causes attraction between the activated sides of component dielectric 1014 and component dielectric 1014', and can cause interconnect second-portion 1017 and interconnect second-portion 1017' to be compressed towards or into each other. During or subsequent to the bonding of component dielectric 1014 to component dielectric 1014', reflow or thermocompression bonding can be performed to bond interconnect second-portions 1017 of electronic component 101 to interconnect second-portions 1017' of electronic component 101'. For example, electronic component 101 and electronic component 101' can be coupled to one another by bonding together the material of interconnect second-portions 1017 and 1017'at a relatively low temperature for a short time, for example as compared to bonding together the material of interconnect first-portions 1016 and 1016'. For example, interconnect second-portions 1017 and interconnect second-portions 1017' can be bonded to each other at a temperature under 250° C., or at a temperature around 220° C. to 260° C., within one minute to ten minutes. As the temperature and time at which the second interconnect portion 1017 and the second interconnect portion 1017' are bonded increase, bonding strength can be strengthened. Electronic component 101 and electronic component 101' can enable low temperature hybrid bonding, by bonding component dielectric 1014 and component dielectric 1014', and bonding interconnect second-portions 1017 and interconnect second-portions 1017', at relatively low temperatures compared to traditional bonding methods. Traditional bonding method can require a heat temperature around 250° C. to 400° C. for greater than an hour, such as about 2 hours.

FIG. 2E shows a cross section view of electronic device 10 at a later stage of manufacture. In the example shown in FIG. 2E, external interconnects 102 can be provided on and coupled to back conductive layer 1019 of electronic component 101'.

External interconnects 102 can be coupled to electronic component 101 through back conductive layer 1019, vertical interconnects 1018, and component bond pads 1013' of electronic component 101'. Electronic component 101 can be coupled to electronic component 101' or can be coupled to external interconnects 102 through electronic component 101'. In some examples, external interconnects 102 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external interconnects 102 can be formed through a reflow process after forming a conductive material containing solder on back conductive layer 1019 positioned on component backside 1012' of electronic component 101' through a ball drop process. Here, component backside 1012' of electronic component 101' can be in a state of facing upwards. External interconnects 102 can comprise or be referred to as conductive balls such as solder balls, conductive pillars such as copper pillars, or conductive posts having solder caps on copper pillars. In some examples, the sizes of external interconnects 102 can range from approximately 25 μm to approximately 250 μm. In some examples, external interconnects 102 can comprise or be referred to as external input/output terminals of electronic device 10. In some examples, after formation of external interconnects 102, a dicing or singulation operation can be performed to provide individual electronic components 10.

Figure 3:
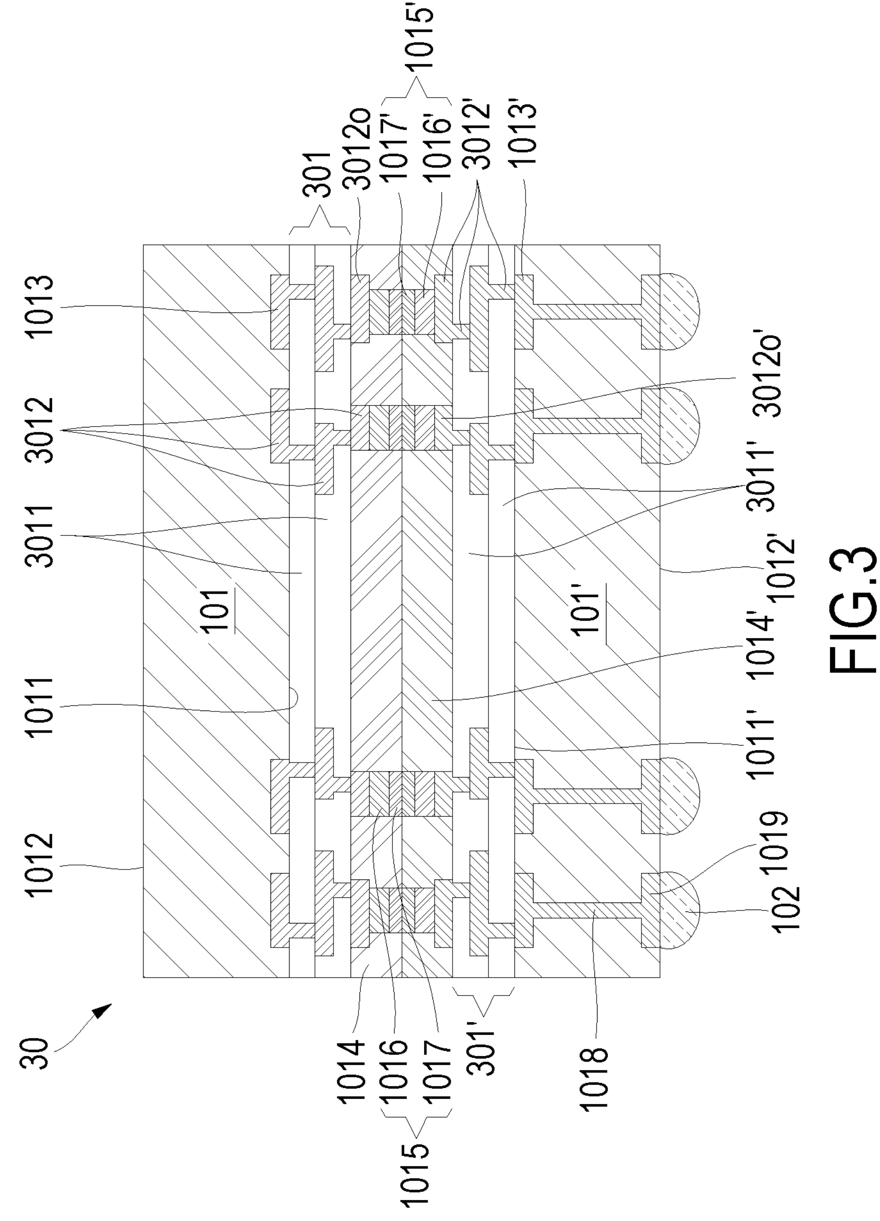
FIG. 3 shows a cross-sectional view of an example electronic device.

FIG. 3 shows a cross-sectional view of an example electronic device 30. In the example shown in FIG. 3, electronic device 30 can comprise electronic components 101 and 101', redistribution structures 301 and 301', and external interconnects 102.

In accordance with various examples, electronic device 30 can be similar to electronic device 10, as previously described. Electronic device 30 can comprise electronic component 101 and electronic component 101' and external interconnects 102. In the present example, electronic component 101 can comprise redistribution structures 301, and electronic component 101' can comprise redistribution structures 301'.

Redistribution structures (RDS) 301 and 301' can comprise RDS dielectric structures 3011 and 3011', respectively, and RDS conductive structures 3012 and 3012', respectively. Conductive structures 3012 and 3012' can comprise outer terminals 3012*o* and 3012*o*'. Conductive structures 3012 and 3012' of redistribution structures 301 and 301' can couple component interconnects 1015 and 1015' and component bond pads 1013 and 1013', respectively. In some examples, electronic component 101 can comprise RDS structure 301 between component inner side 1011 and component dielectric 1014. In some examples, electronic component 101' can comprise RDS structure 301' between component inner side 1011' and component dielectric 1014'. In some examples, RDS dielectric structures 3011 and 3011' can comprise an organic material.

Conductive structures 3012 and 3012' can be one or more conductive layers defining conductive paths with elements such as traces, pads, vias and wiring patterns. Conductive structures 3012 and 3012' can comprise outer terminals 3012*o*, 3012*o*', respectively. In some examples, outer terminals 3012*o*, 3012*o*' can comprise or be referred to as a conductor, a conductive material, a land, a conductive land, a pad, a wiring pad, a connection pad, a micro pad, or under bump metallization (UBM). In some examples, conductive structures 3012 and 3012' can comprise copper, iron, nickel, gold, silver, palladium, or tin. Component interconnects 1015 can be coupled to or contact outer terminals 3012*o* and component interconnects 1015' can be coupled to or contact outer terminals 3012*o*'. In some examples, dielectric structures 1014 and 1014' can cover a sidewall, or lateral side, of outer terminals 3012 or 3102', respectively.

In some examples, dielectric structures 3011 and 3011' can comprise or be referred to as one or more dielectric or insulating layers. In some examples, the dielectric materials of dielectric structures 3011 or 3011' can comprise one or more organic dielectric layers. For instance, the one or more dielectric layers can comprise, one or more layers of polyimide (PI), benzocyclobutene (BCB), or polybenzoxazole (PBO). In some examples, the dielectric materials of dielectric structures 3011 or 3011' can comprise one or more inorganic dielectric layers. For instance, the one or more inorganic dielectric layers can comprise silicon nitride ($Si_3N_4$), silicon oxide ($SiO_2$), or silicon oxynitride (SiON). One or more layers or elements of conductive structures 3012 or 3012' can be interleaved with the layers of dielectric structure 3011, 3011' respectively.

Redistribution structure 301 can be interposed between of component inner side 1011 and component dielectric 1014 of electronic component 101. Redistribution structure 301' can be interposed between of component inner side 1011' and component dielectric 1014' of electronic component 101'.

Figure 4:
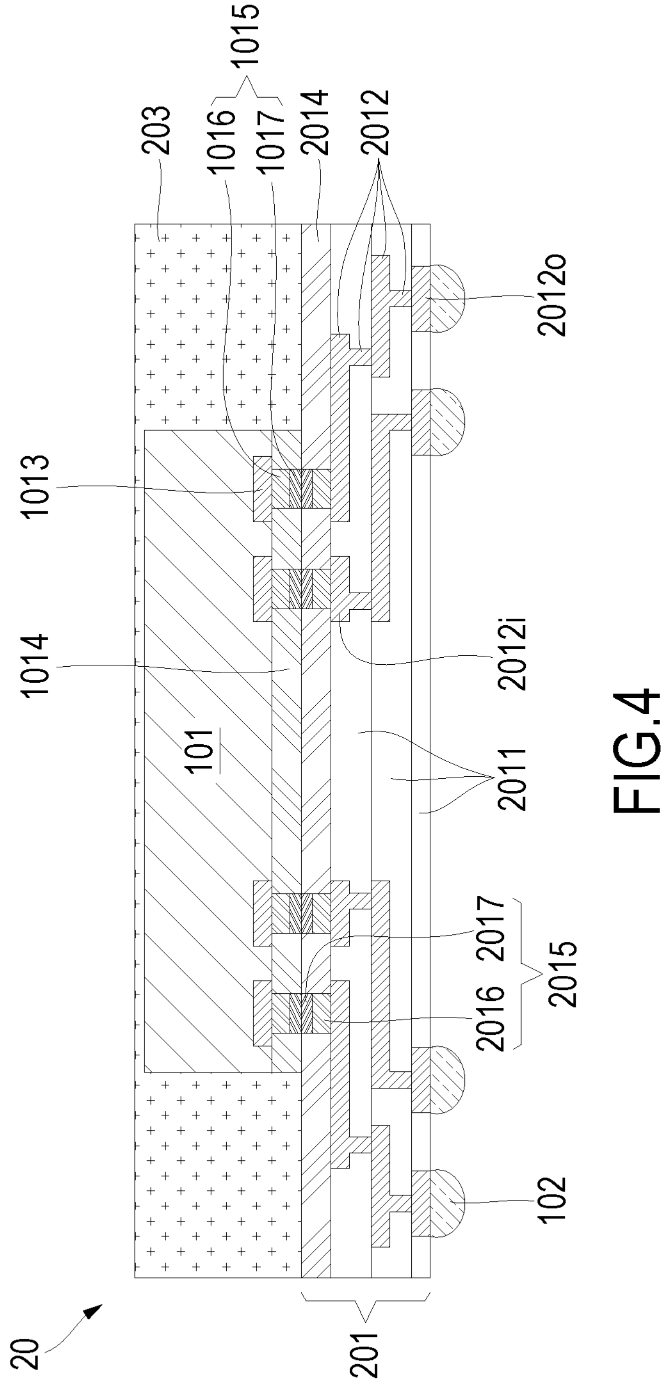
FIG. 4 shows a cross-sectional view of an example electronic device.

FIG. 4 shows a cross-sectional view of an example electronic device 20. In the example shown in FIG. 4, electronic device 20 can comprise electronic component 101, external interconnects 102, substrate 201, and encapsulant 203. In the present example, electronic component 101 and external interconnects 102 can be similar to electronic component 101 and external interconnects 102, as previously described with respect to electronic device 10. In some examples, electronic component 101 can comprise a semiconductor chip, and encapsulant 203 can contact a lateral side of the semiconductor chip, or a top side of the semiconductor chip.

Substrate 201 can be referred to as a component and can comprise dielectric structure 2011, conductive structure 2012, substrate dielectric 2014, and substrate interconnects 2015. Conductive structure 2012 can comprise inner terminals 2012*i* and outer terminals 2012*o*. Substrate interconnects 2015 can comprise interconnect first-portions 2016 and interconnect second-portions 2017. In some examples, substrate dielectric 2014 can extend beyond a perimeter of component dielectric 1015. In some examples, substrate 201, or component 201, can comprise a redistribution structure (RDS) dielectric structure and can be similar to redistribution structures 301 or 301' of FIG. 3. In such examples, substrate 201 can comprise RDS dielectric structure 2011 and RDS conductive structure 2012. In some examples, substrate 201, or component 201, can be exposed at the component backside of substrate 201, or component 201.

Figures 5A, 5B:
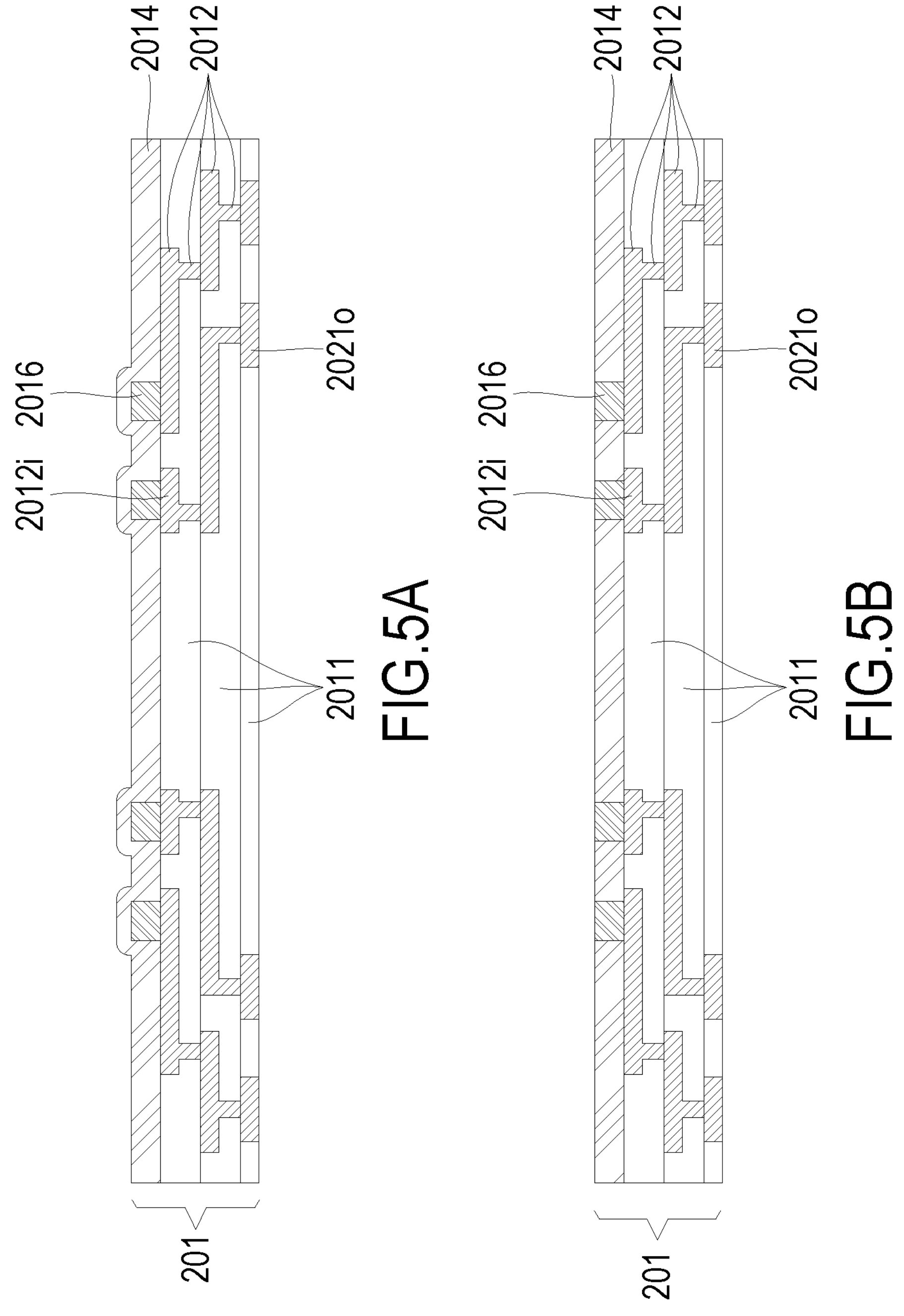
FIGS. 5A-5F show cross-sectional views of an example method for manufacturing an example electronic device.

FIGS. 5A to 5F show cross-sectional views of an example method for manufacturing an example electronic device, such as electronic device 20 in FIG. 4. FIG. 5A shows a cross section view of electronic device 20 at an early stage of manufacture. In the example shown in FIG. 5A, interconnect first-portions 2016 and substrate dielectric layer 2014 can be provided on substrate 201.

Substrate 201 can comprise conductive structure 2012 and dielectric structure 2011. Conductive structure 2012 can be one or more conductive layers defining a conductive path with elements such as traces, pads, vias, or wiring patterns. Conductive structure 2012 can comprise inner terminals 2012*i* provided on the upper side, or first side, of substrate 201 and outer terminals 2012*o* provided on the lower side, or second side, of substrate 201. In some examples, inner terminals 2012*i* or outer terminals 2012*o* can comprise or be referred to as a conductor, a conductive material, a substrate land, a conductive land, a substrate pad, a wiring pad, a connection pad, a micro pad, trace, or under bump metallization (UBM). In some examples, conductive structure 2012 can comprise copper, iron, nickel, gold, silver, palladium, or tin. In some examples, the thicknesses of inner terminals 2012*i* or outer terminals 2012*o* can range from approximately 10 μm to 100 μm.

In some examples, dielectric structure 2011 can comprise or be referred to as one or more stacked dielectric layers. For instance, the one or more dielectric layers can comprise, one or more core layers, polymer layers, pre-preg layers, or solder mask layers stacked on each other. One or more layers or elements of conductive structure 2012 can be interleaved with dielectric structure 2011. In some examples, dielectric structure 2011 can comprise an epoxy resin, a phenolic resin, a glass epoxy, a polyimide, a polyester, an epoxy molding compound, or a ceramic.

In some examples, substrate 201 can comprise or be referred to as a laminate substrate, a ceramic substrate, a rigid substrate, a glass substrate, a silicon substrate, a printed circuit board, a multilayer substrate, or a molded lead frame. In some examples, substrate 201 can have a thickness of about 0.2 mm to about 4 mm.

In some examples, substrate 201 can be a pre-formed substrate. Pre-formed substrates can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In some examples, the pre-formed substrate can be a coreless substrate and omits the permanent core structure, and the dielectric and conductive layers can be formed on a sacrificial carrier and is removed after formation of the dielectric and conductive layers and before attachment to the electronic device. The pre-formed substrate can referred to as a printed circuit board (PCB) or a laminate substrate. Such pre-formed substrate can be formed through a semi-additive or a modified semi-additive process. Substrates, as disclosed herein, can comprise pre-formed substrates.

In some examples, substrate 201 can be an RDL substrate. RDL substrates can comprise one or more conductive redistribution layers and one or more dielectric layers and (a) can be formed layer by layer over an electronic device to where the RDL substrate is to be coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, and can include a photolithographic mask through where light is exposed to photo-pattern desired features such as vias in the dielectric layers. The dielectric layers can be made from photo-definable organic dielectric materials such as, for example, PI, BCB, or PBO. Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials previously described can be organic materials, in some examples the dielectric materials of the RDL substrates can comprise one or more inorganic dielectric layers. Some examples of one or more inorganic dielectric layers can comprise silicon nitride (Si3N4), silicon oxide (SiO2), or silicon oxynitride (SiON). The one or more inorganic dielectric layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Substrates, as disclosed herein, can comprise RDL substrates.

Interconnect first-portions 2016 can be provided on inner terminals 2012*i* of conductive structure 2012. Interconnect first-portions 2016 can include elements, features, materials, or manufacturing methods similar to those previously described for interconnect first-portions 1016. Substrate dielectric layer 2014 can include elements, features, materials, or manufacturing methods similar to those previously described for component dielectric 1014.

FIG. 5B shows a cross section view of electronic device 20 at a later stage of manufacture. In the process of manufacture shown in FIG. 4B, the upper portion of substrate dielectric layer 2014 can be removed, and the upper sides of interconnect first-portions 2016 can be exposed to the upper side of substrate dielectric layer 2014. The method for removing the upper portion of substrate dielectric layer 2014 can be similar to the method for removing the upper portion of component dielectric 1014, as previously described with reference to FIG. 2B.

Figures 5C, 5D:
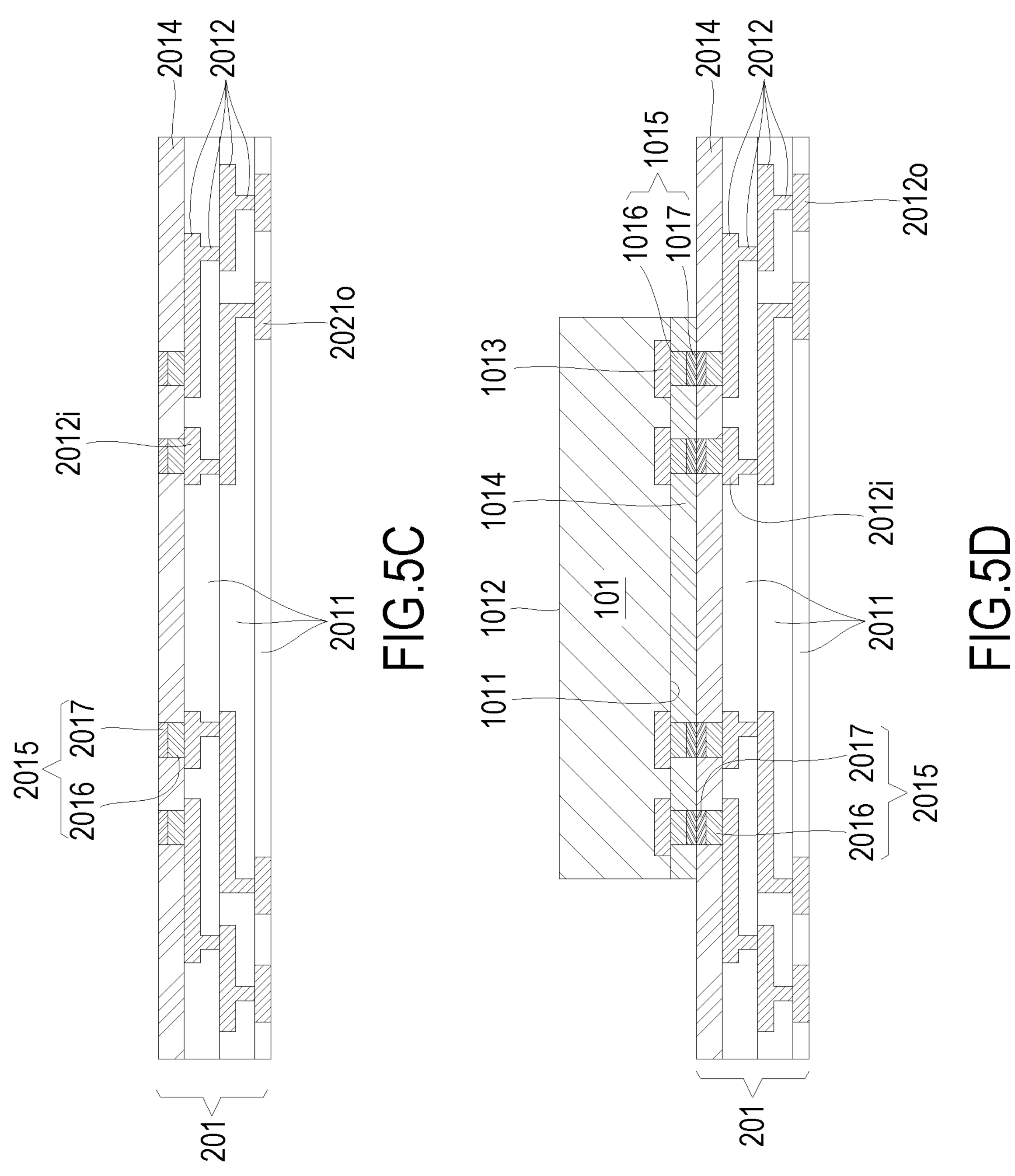

FIG. 5C shows a cross section view of electronic device 20 at a later stage of manufacture. In the process of manufacture shown in FIG. 5C, interconnect second-portions 2017 can be provided on interconnect first-portions 2016. In accordance with various examples, interconnect second-portions 2017 can be provided by displacing some of the upper portion of interconnect first-portions 2016 with the material of interconnect second-portions 2017. In some examples, displacement plating of interconnect first-portions 2016 with interconnect second-portions 2017 can be similar to the displacement plating of interconnect first-portions 1016 with interconnect second-portions 1017, as previously described with reference to FIGS. 2C and 2C-1.

FIG. 5D shows a cross section view of electronic device 20 at a later stage of manufacture. In the process of manufacture shown in FIG. 5D, component dielectric 1014 of electronic component 101 can be bonded to substrate dielectric layer 2014 of substrate 201, and component interconnects 1015 of electronic component 101 can be bonded to substrate interconnects 2015 of substrate 201. The method for bonding electronic component 101 and substrate 201 can be similar to the method for bonding electronic component 101 and electronic component 101', previously described with reference to FIG. 2D.

Figure 5E:
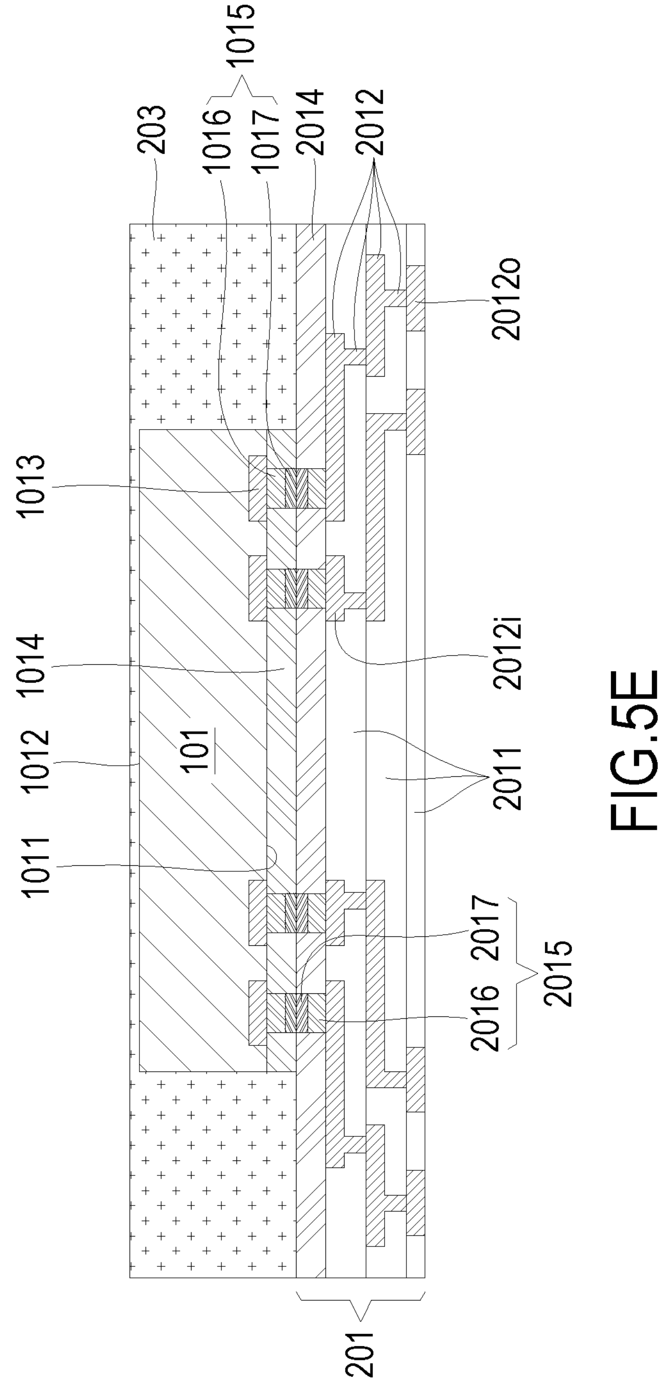

FIG. 5E shows a cross section view of electronic device 20 at a later stage of manufacture. In the process of manufacture shown in FIG. 5E, encapsulant 203 can be provided over substrate 201 and electronic component 101. In some examples, encapsulant 203 can cover substrate dielectric layer 2014 of substrate 201 and electronic component 101. Encapsulant 203 can contact the upper side of substrate dielectric layer 2014 and the upper side and sidewalls, or lateral sides, of electronic component 101. In some examples, encapsulant 203 can comprise or be referred to as a body or a molding. For example, encapsulant 203 can comprise an epoxy mold compound, resin, organic polymer with inorganic filler, a hardener, a catalyst, a coupling agent, a colorant, or a flame retardant and can be formed by compression molding, transfer molding, liquid body molding, vacuum lamination, paste printing or film assist molding. Encapsulant 203 can protect electronic component 101 from external elements. In some examples, the thickness of encapsulant 203 can range from approximately 100 μm to approximately 1200 μm.

Figure 5F:
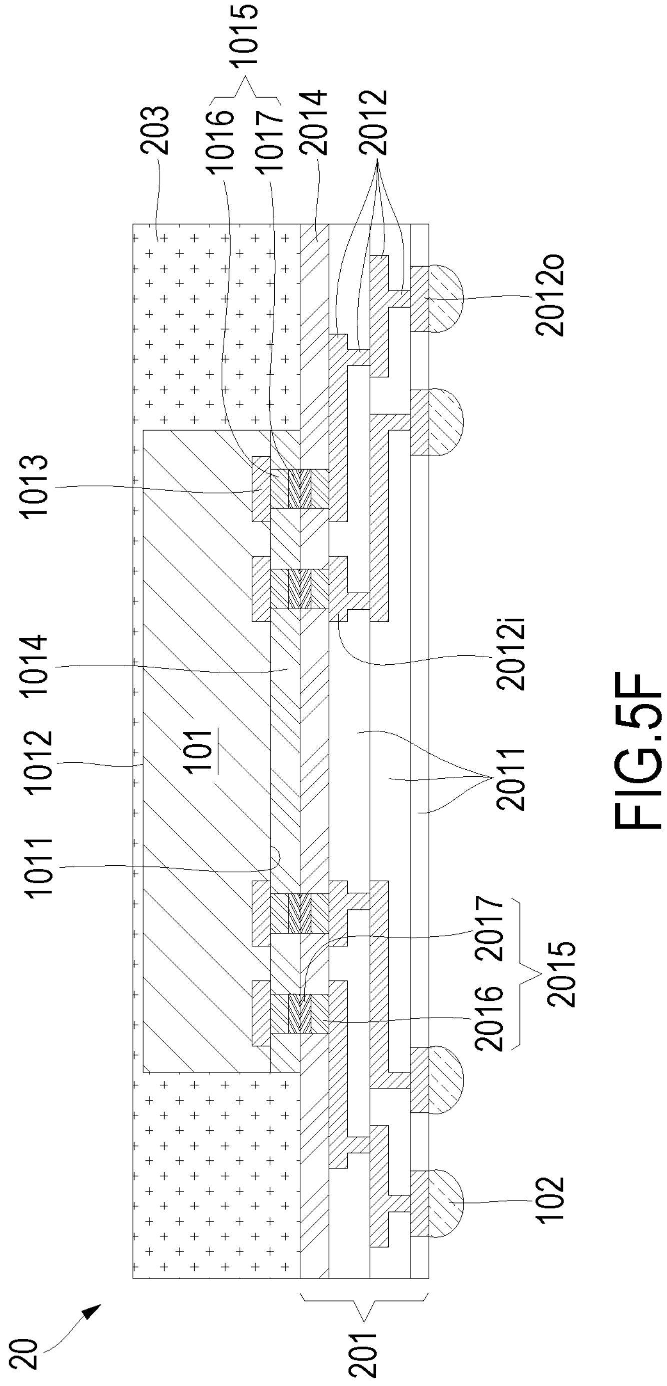

FIG. 5F shows a cross section view of electronic device 20 at a later stage of manufacture. In the process of manufacture shown in FIG. 5F, external interconnects 102 can be provided. External interconnects 102 coupled to or contact outer terminals 2012*o* of substrate 201. The method for providing external interconnects 102 can be similar to the method for providing external interconnects 102, as previously described with reference to FIG. 2E.

Figure 6:
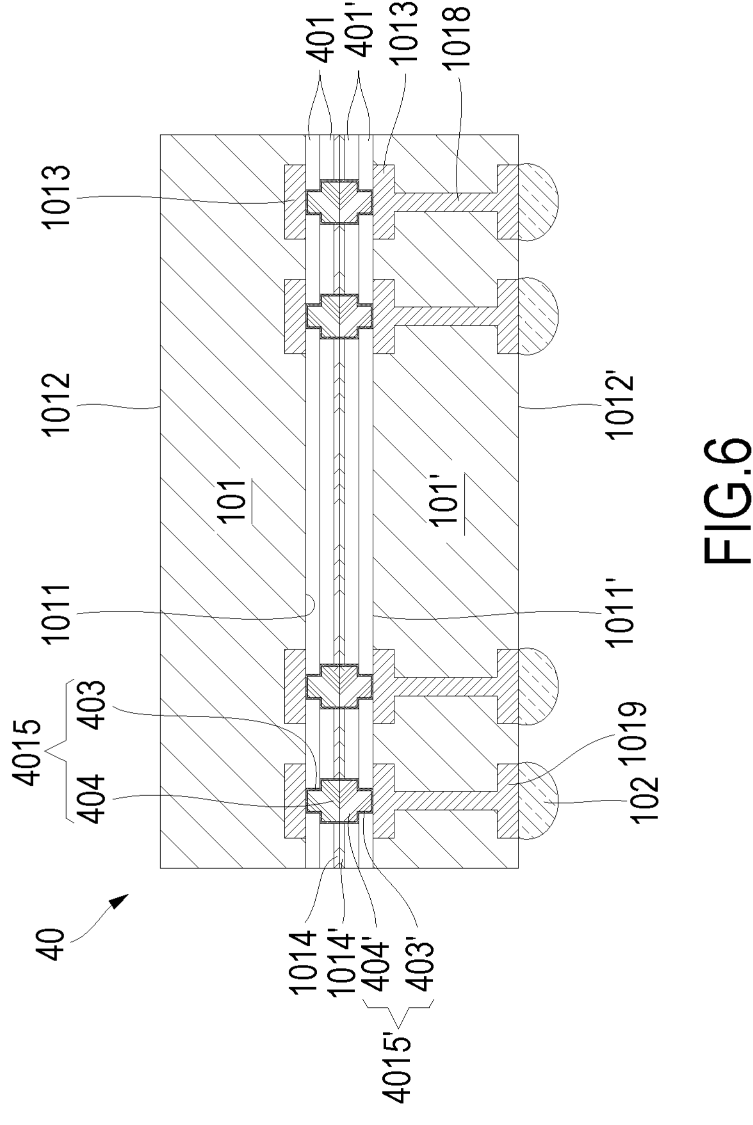
FIG. 6 shows a cross-sectional view of an example electronic device.

FIG. 6 shows a cross-sectional view of an example electronic device 40. In the example shown in FIG. 6, electronic device 40 can comprise electronic components 101 and 101' and external interconnects 102. Electronic component 101 can comprise component inner side 1011, component backside 1012, component bond pads 1013, component dielectric 1014, component interconnects 4015, and component insulating structure 401. Electronic component 101' can comprise component inner side 1011', component backside 1012', component bond pads 1013', component dielectric 1014', component interconnects 4015', component insulating structure 401', vertical interconnects 1018, and back conductive layer 1019. Component interconnects 4015 can comprise seed layer 403 and plating 404. Component interconnects 4015' can comprise seed layer 403' and plating 404'. In some examples, plating 404 can contact plating 404'. In some examples, insulating structure 401 can be between component inner side 1011 and component dielectric 1014, and insulating structure 401' can be between component inner side 1011' and component dielectric 1014'. In some examples, insulating structures 401 or 401' can comprise one or more organic layers comprising an organic material such as polyimide (PI), benzocyclobutene (BCB), or polybenzoxazole (PBO). In some examples, one or more of the organic layers of insulating structure 401 can contact a lateral side of component interconnect 4015, or one or more of the organic layers of insulating structure 401' can contact a lateral side of component interconnect 4015'.

Figures 7A, 7B:
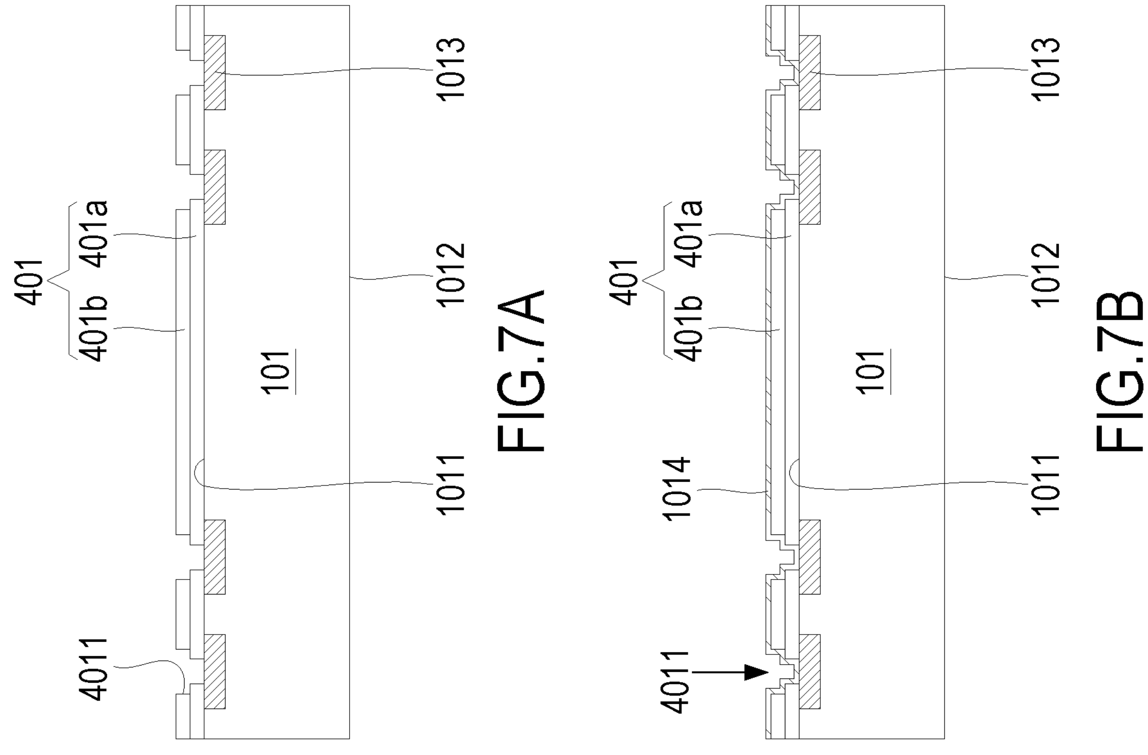
FIGS. 7A-7G show cross-sectional views of an example method for manufacturing an example electronic device.

FIGS. 7A to 7G show cross-sectional views of an example method for manufacturing an example electronic device. FIG. 7A shows a cross section view of electronic device 40 at an early stage of manufacture. In the process of manufacture shown in FIG. 7A, component insulating structure 401 can be provided on component inner side 1011 of electronic component 101. In some examples, apertures 4011 exposing the upper sides of component bond pads 1013 can be provided in component insulating structure 401. For example, after a mask pattern is provided on the upper side of component insulating structure 401, apertures 4011 can be providing by etching portions of component insulating structure 401 exposed from the mask. In some examples, the mask pattern can comprise photoresist. In some examples, apertures 4011 can have a step or can have an upper portion having larger width than the lower portion. In some examples, apertures 4011 can be referred to as or comprise openings or holes. In some examples, component insulating structure 401 can comprise or be referred to as a dielectric layer, insulating layer, a coreless layer, or a filler-free layer. In some examples, component insulating structure 401 can comprise or be referred to as one or more insulating layers, such as organic insulating layers. For example, component insulating structure 401 can comprise first insulating layer 401*a* and second insulating layer 401*b*. In some examples, component insulating structure 401 can comprise an electrically insulating material, such as polymer, polyimide (PI), benzocyclobutene (BCB), polybenzoxazole (PBO), bismaleimide triazine (BT), a molding material, a phenolic resin, an epoxy, silicone, or an acrylate polymer. In some examples, component insulating structure 401 can be formed by spin coating, spray coating, dip coating, or rod coating. In some examples, the thickness of component insulating structure 401 can range from approximately 10 μm to approximately 50 μm. The thickness of component insulating structure 401 can refer to the individual layers, for example first insulating layer 401*a* and second insulating layer 401*b*, of component insulating structure 401.

FIG. 7B shows a cross section view of electronic device 40 at a later stage of manufacture. In the process of manufacture shown in FIG. 7B, component dielectric 1014 can be provided on component insulating structure 401, component bond pads 1013, and the inner walls of apertures 4011. In some examples, component dielectric 1014 can cover component insulating structure 401, component bond pads 1013, and the inner walls of apertures 4011. The method for providing component dielectric 1014 can be similar to the method for providing component dielectric 1014 shown in FIG. 2A. In some examples, the thickness of component dielectric 1014 can range from approximately 5 μm to approximately 20 μm.

Figures 7C, 7D:
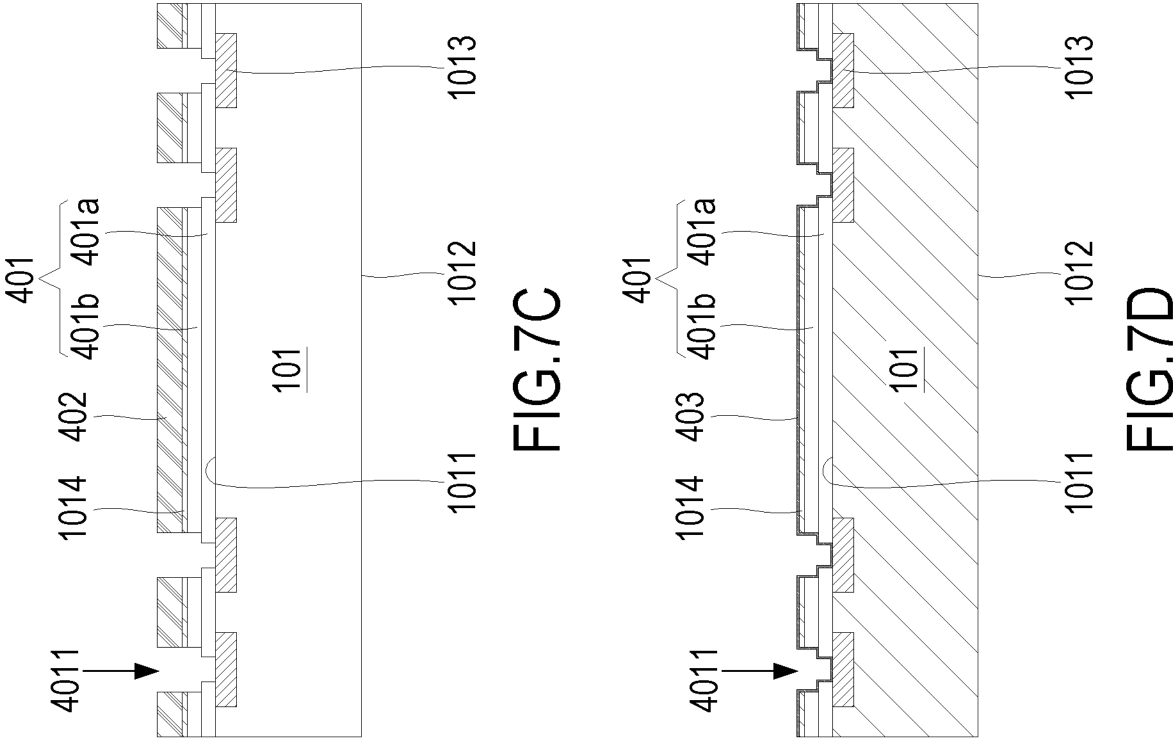

FIG. 7C shows a cross section view of electronic device 40 at a later stage of manufacture. In the process of manufacture shown in FIG. 7C, component bond pads 1013 and apertures 4011 can be exposed by patterning component dielectric 1014, for example by removing portions thereof. In some examples, a photoresist 402 can be provided at the upper side of component dielectric 1014, and the portions of component dielectric 1014 covering component bond pads 1013 and apertures 4011 can be removed by etching. Photoresist 402 can be provided with patterns so as to expose component dielectric 1014 covering component bond pads 1013 and apertures 4011 to the outside. Photoresist 402 can be provided to cover the upper side of component dielectric 1014 positioned on component insulating structure 401. Photoresist 402 can be removed after component bond pads 1013 and apertures 4011 are exposed.

FIG. 7D shows a cross section view of electronic device 40 at a later stage of manufacture. In the process of manufacture shown in FIG. 7D, seed layer 403 can be provided over dielectric 1014 and component bond pads 1013 and in apertures 4011. In some examples, seed layer 403 can consist of one or more conductive layers. Seed layer 403 can be provided to cover the upper side of component dielectric 1014, the upper side of component bond pads 1013, and the inner walls of apertures 4011. In some examples, seed layer 403 can comprise or be referred to as a conductive layer or a barrier layer. For example, seed layer 403 can comprise titanium (Ti), tungsten titanium (TiW), or copper (Cu). In some examples, seed layer 403 can be provided by electroless plating, electroplating, sputtering, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, the thickness of seed layer 403 can range from approximately 0.05 μm to approximately 3 μm.

Figure 7E:
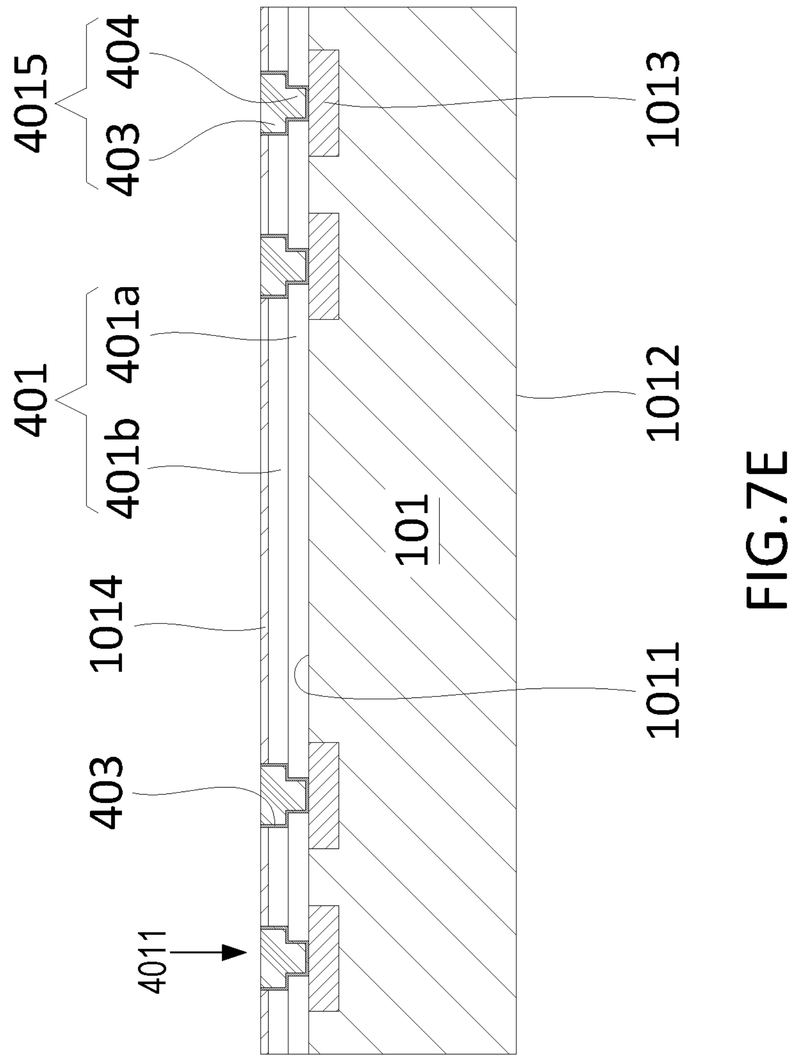

FIG. 7E shows a cross section view of electronic device 40 at a later stage of manufacture. In the process of manufacture shown in FIG. 7E, plating 404 can be provided on the upper side of seed layer 403. Plating 404 can be provided to fill apertures 4011. Plating 404 can be coupled to seed layer 403. In some examples, plating 404 can comprise copper. In some examples, plating 404 can be provided by electroplating by using seed layer 403 as a seed. In some examples, initially plating 404 can entirely cover seed layer 403 and then portions of plating 404 and seed layer 403 that are located outside apertures 4011 can be removed through a planarization process, such as, for example, through chemical mechanical planarization (CMP), also referred to as chemical mechanical polishing. The upper side of plating 404 can be coplanar with the upper side of component dielectric 1014. In some examples, plating 404 can be recessed with respect to the upper side of component dielectric 1014. For example, after the CMP process an etching process can be performed to remove reduce a thickness plating 404, such that the upper side of plating 404 is below the upper side of component dielectric 1014. After plating 404 is provided, the upper side of component dielectric 1014 can be activated, such as by hydroxyl groups on the upper side of component dielectric 1014. The activation of component dielectric 1014 can be similar to the activation of component dielectric 1014, as described with reference to FIG. 2C.

Plating 404 can be coupled to component bond pads 1013 through seed layer 403. In some examples, plating 404 can include corresponding elements, features, materials, or manufacturing method similar to previously described for interconnect first-portions 1016 of electronic device 10. Component interconnects 4015 can comprise seed layer 403 and plating 404. Component interconnects 4015 can penetrate component insulating structure 401 and component dielectric 1014. Component insulating structure 401, component dielectric 1014, and component interconnects 1015 can be included in electronic component 101. In some examples, the overall thickness of component interconnects 4015 can range from approximately 5 μm to approximately 20 μm.

Figure 7F:
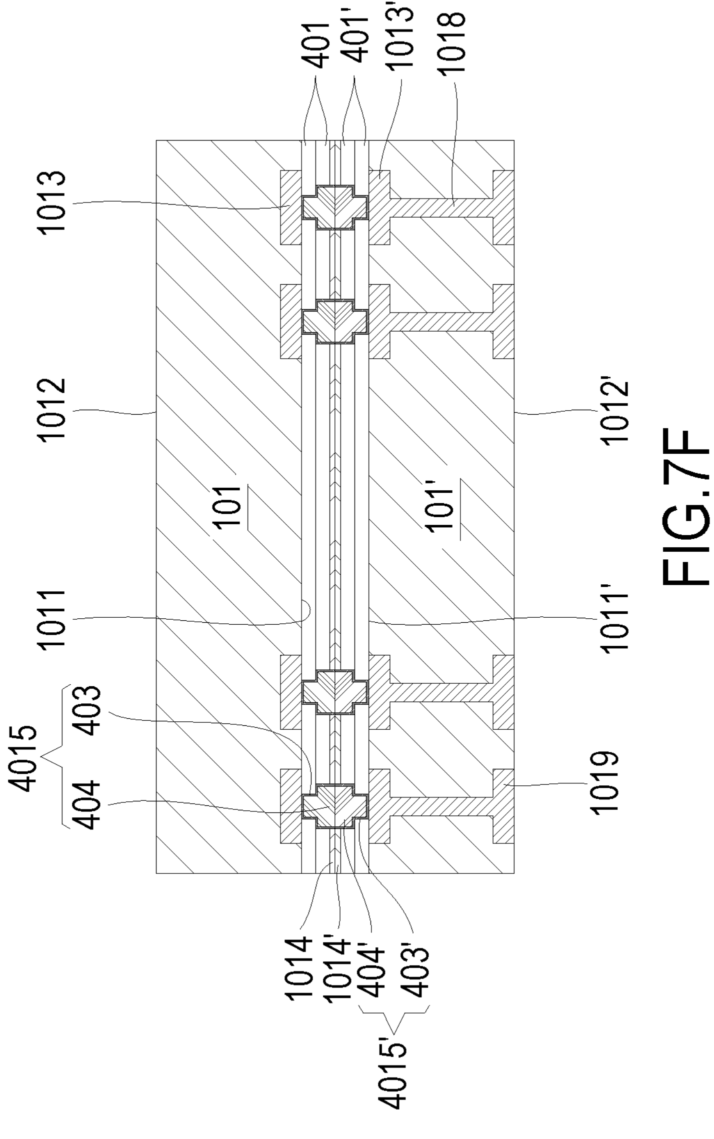

FIG. 7F shows a cross section view of electronic device 40 at a later stage of manufacture. In the process of manufacture shown in FIG. 7F, electronic components 101 and 101' can be bonded together. In some examples, electronic component 101' can comprise features, elements, or formation similar to corresponding ones of electronic component 101. Component dielectric 1014 of electronic component 101 can be bonded to component dielectric 1014' of electronic component 101', and component interconnects 4015 of electronic component 101 can be bonded to component interconnects 4015' of electronic component 101'. In some examples, electronic component 101' can include corresponding elements, features, materials, or manufacturing method similar to previously described for electronic component 101 manufactured by the manufacturing method of FIGS. 7A to 7E. Electronic component 101' can comprise vertical interconnects 1018 and back conductive layer 1019. Vertical interconnects 1018 and back conductive layer 1019 can be similar to those of electronic component 101' of electronic device 10 shown in FIG. 2D. The bonding method between component dielectric 1014 of electronic component 101 and component dielectric 1014' of electronic component 101' can be similar to the bonding method for electronic device 10, as described with reference to FIG. 2D. The bonding of component dielectric 1014 to component dielectric 1014' can cause metal to metal bonding, for example copper-copper bonding, of plating 404 to plating 404', for example via hybrid bonding. In some examples, component interconnects 4015 of electronic component 101 can be bonded to component interconnects 4015' of electronic component 101' through thermal compression or heat treatment.

Figure 7G:
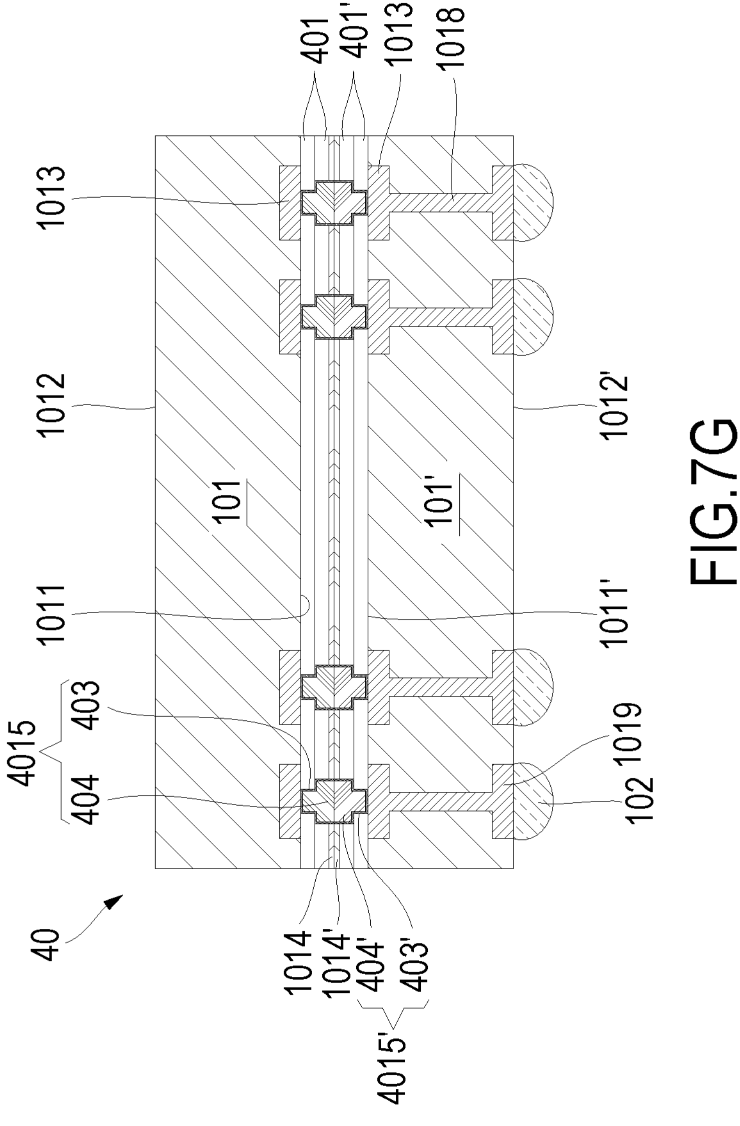

FIG. 7G shows a cross section view of electronic device 40 at a later stage of manufacture. In the process of manufacture shown in FIG. 7G, external interconnects 102 can be provided. External interconnects 102 can be coupled to backside conductive layer 1019 of electronic component 101'. The method for providing external interconnects 102 can be similar to the method for providing external interconnects 102 of electronic device 10 shown in FIG. 2E.

Electronic device 40 can comprise electronic components 101 and 101' and external interconnects 102. Electronic component 101 can comprise component inner side 1011, component backside 1012, component bond pads 1013, component dielectric 1014, component interconnects 4015, and component insulating structure 401. Electronic component 101' can comprise component inner side 1011', component backside 1012', component bond pads 1013', component dielectric 1014', component interconnects 4015', component insulating structure 401', vertical interconnects 1018, and back conductive layer 1019. Component interconnects 4015 can comprise seed layer 403 and plating 404. Component interconnects 4015' can comprise seed layer 403' and plating 404'. In some examples, the material of component insulating structures 401 and 401' can be more effective than the material of component dielectric 1014 and component dielectric 1014' for preventing diffusion of the material of platings 404 and 404' at high temperatures, thereby improving electrical characteristics such as signal integrity for electronic device 40. In some examples, the material of component insulating structures 401 and 401' can facilitate layer formation, such as being easier, quicker, or less expensive to form, compared to the material of component dielectric 1014 and component dielectric 1014', such that the thicknesses of component insulating structures 401 or 401' or of plating 404 or plating 404' can be more freely increased or adjusted.

Figure 8:
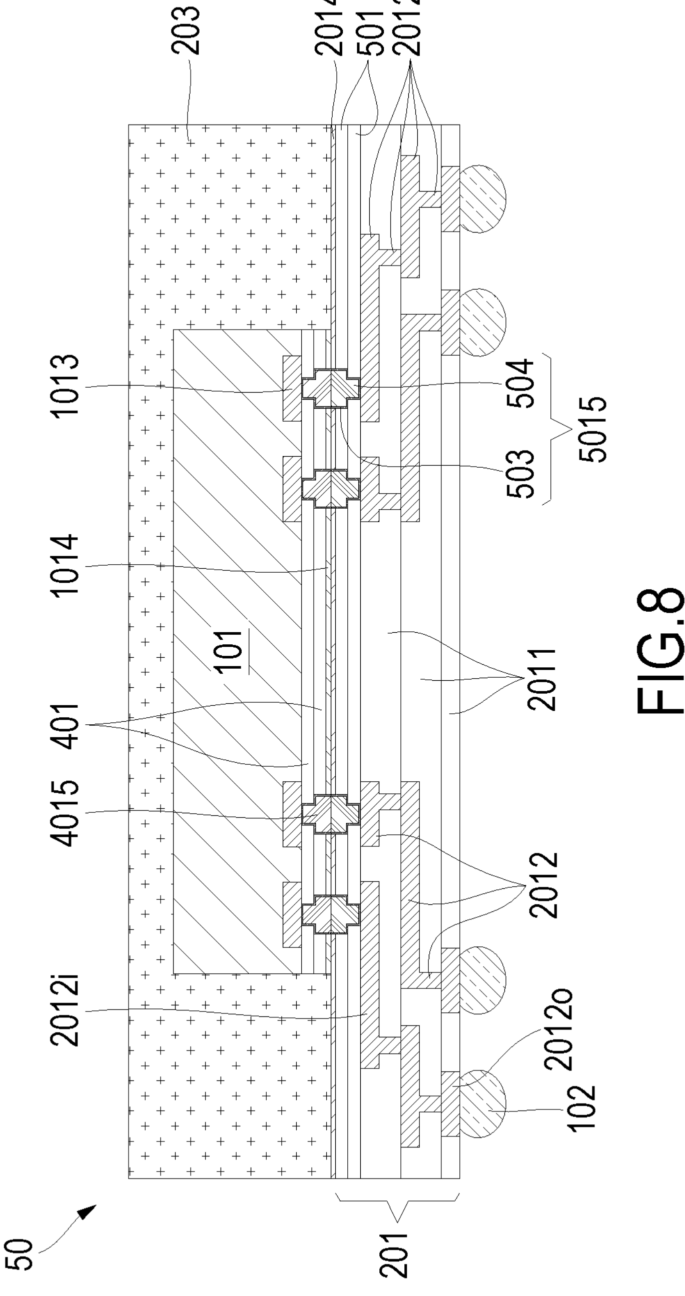
FIG. 8 shows a cross-sectional view of an example electronic device.

FIG. 8 shows a cross-sectional view of an example electronic device 50. In the example shown in FIG. 8, electronic device 50 can comprise electronic component 101, external interconnects 102, substrate 201, and encapsulant 203. In the present example, electronic component 101 and external interconnects 102 can be similar to electronic component 101 and external interconnects 102 of electronic device 40 previously described. For example, in electronic component 101 of electronic device 50, component insulating structure 401, component bond pads 1013, component dielectric 1014, component interconnects 4015, and component insulating structure 401 can be similar to corresponding elements of electronic device 40. In the present example, substrate 201 and encapsulant 203 can be similar to substrate 201 and encapsulant 203 of electronic device 20 previously described. For example, dielectric structure 2011, conductive structure 2012, and substrate dielectric layer 2014 of substrate 201 can be similar to corresponding elements of electronic device 20.

In the present example, substrate 210 can comprise substrate insulating structure 501 interposed between dielectric structure 2011 and substrate dielectric layer 2014. Substrate interconnects 5015 are coupled to component interconnects 4015 and to inner terminals **2012*i* of substrate 210. Substrate interconnects 5015 can extend or penetrate through substrate insulating structure 501. Substrate insulating structure 501 can include corresponding elements, features, materials, or manufacturing method similar to previously described for component insulating structure 401 of electronic device 40. Substrate interconnects 5015 can include corresponding elements, features, materials, or manufacturing method similar to previously described for component interconnects 4015 of electronic device 40**.

Figure 9:
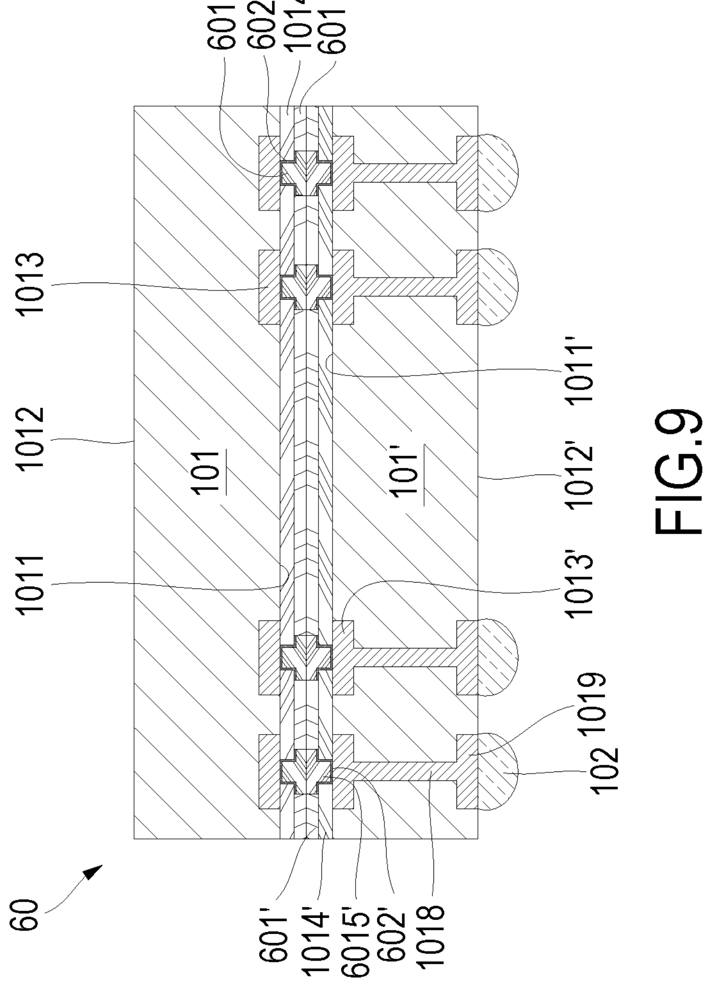
FIG. 9 shows a cross-sectional view of an example electronic device.

FIG. 9 shows a cross-sectional view of an example electronic device 60. In the example shown in FIG. 9, electronic device 60 can comprise electronic components 101 and 101', external interconnects 102, and component dielectrics 601 and 601'.

In the present example, electronic device 60 can be similar to electronic device 10 previously described in terms of electronic components 101 and 101' and external interconnects 102. For example, electronic device 60 can be similar to electronic device 10 in terms of component bond pads 1013 and 1013' and component dielectric 1014 and component dielectric 1014' of electronic components 101 and 101'. For example, in electronic component 101' of electronic device 60, vertical interconnects 1018 and back conductive layer 1019 can be similar to corresponding elements of electronic device 10. In the present example, electronic components 101 and 101' of electronic device 60 can comprise component interconnects 6015 and 6015'. Component interconnects 6015 and 6015' can comprise seed layers 602 and 602'. In some examples, component interconnects 6015 and 6015' can comprise solder or tin or a tin alloy. In some examples, component dielectrics 1014 or 1014' can comprise nitride layers or oxide layers, wherein the nitride layer or the oxide layer of component dielectric 1014 contacts the nitride layer or the oxide layer of component dielectric 1014'. In some examples, the inorganic material of component dielectrics 1014 or 1014' can comprise a nitride layer and an oxide layer.

Figures 10A, 10B:
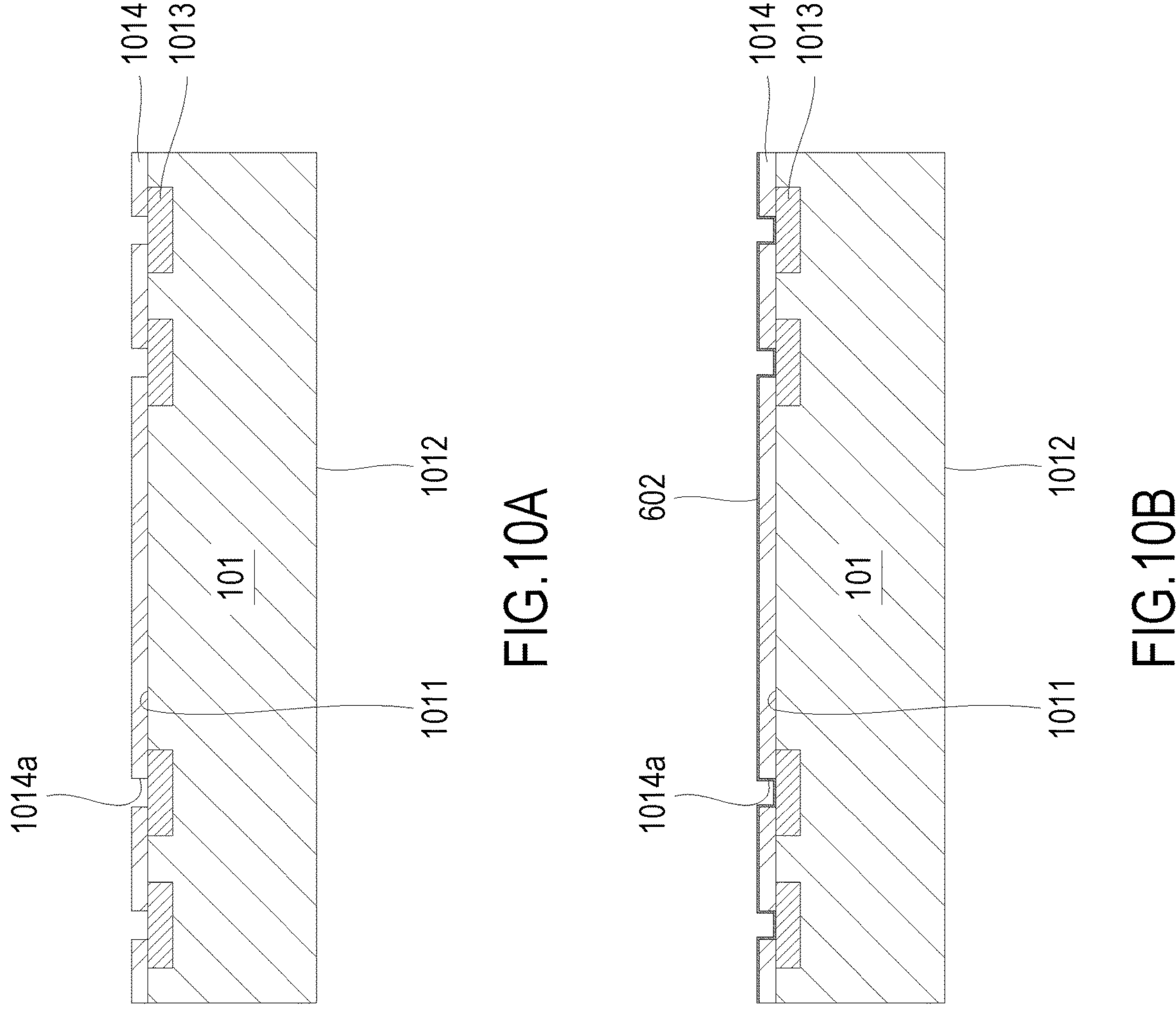
FIGS. 10A-10G show cross-sectional views of an example method for manufacturing an example electronic device.

FIGS. 10A to 10G show cross-sectional views of an example method for manufacturing an example electronic device. FIG. 10A shows a cross section view of electronic device 60 at an early stage of manufacture. In the process of manufacture shown in FIG. 10A, component dielectric 1014 can be provided on component inner side 1011 of electronic component 101. After component dielectric 1014 is provided to cover component inner side 1011 and component bond pads 1013, apertures **1014*a* exposing the upper sides of component bond pads 1013 can be provided. Component dielectric 1014 of electronic device 60 can include corresponding elements, features, materials, or manufacturing method similar to previously described for component dielectric 1014 of electronic device 10. The method for providing apertures 1014*a* to component dielectric 1014 can be similar to the method for providing apertures 4011 to component insulating structure 401 in electronic device 40 shown in FIG. 7**A.

FIG. 10B shows a cross section view of electronic device 60 at a later stage of manufacture. In the process of manufacture shown in FIG. 10B, seed layer 602 can be provided to cover component dielectric 1014, component bond pads 1013 and the inner walls of apertures **1014*a*. Seed layer 602 of electronic device 60 can include corresponding elements, features, materials, or manufacturing method similar to previously described for seed layer 403 of electronic device 40**.

Figures 10C, 10D:
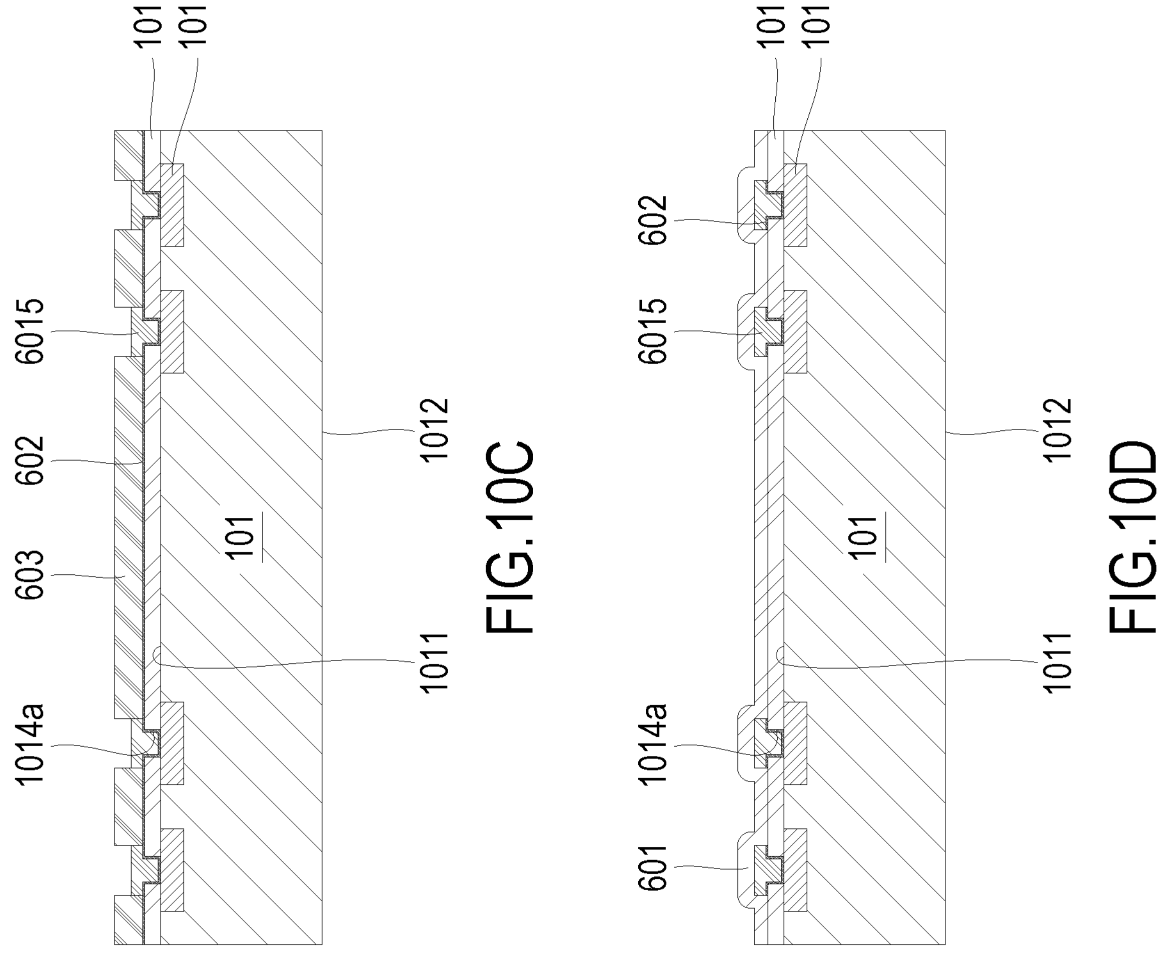

FIG. 10C shows a cross section view of electronic device 60 at a later stage of manufacture. In the process of manufacture shown in FIG. 10C, component interconnects 6015 can be provided to fill apertures 1014*a*. Component interconnects 6015 can be provided through electroplating by using, as a seed, seed layer 602 covering the inner walls of apertures 1014*a* and the upper sides of component bond pads 1013. For example, after photoresist 603 is provided to cover the upper side of the component dielectric 1014 in seed layer 602, component interconnects 6015 can be provided through electroplating by using exposed seed layer 602 as a seed. After providing component interconnects 6015, photoresist 402 can be removed. After removing photoresist 402, exposed seed layer 602 can also be removed.

Component interconnects 6015 can be coupled to component bond pads 1013 through seed layer 602. Seed layer 602 can be included in component interconnects 6015. Component interconnects 6015 can extend to the upper side of component dielectric 1014 adjacent to apertures 1014*a*. Component interconnects 6015 can include corresponding elements, features, materials, or manufacturing method similar to previously described for interconnect second-portions 1017 of electronic device 10. In some examples, the overall thickness of component interconnects 6015 can range from approximately 5 μm to approximately 20 μm. Component interconnects 6015 can be made of bump, solder, Sn, or a low melting-point material, and thus, connection can be facilitated at low temperatures and surface oxidation can be prevented. Since component interconnects 6015 are provided to be in contact with and electrically connected to component bond pads 1013, separate surface displacement plating cannot be required.

FIG. 10D shows a cross section view of electronic device 60 at a later stage of manufacture. In the process of manufacture shown in FIG. 10D, component dielectric 601 can be provided to cover component interconnects 6015 and the upper side of component dielectric 1014. Component dielectric 601 can include corresponding elements, features, materials, or manufacturing method similar to previously described for component dielectric 1014 of electronic device 10. In some examples, component dielectric 601 can be a nitride layer, such as a silicon nitride layer, and component dielectric 1014 can be an oxide layer, such as a silicon oxide layer.

Figure 10E:
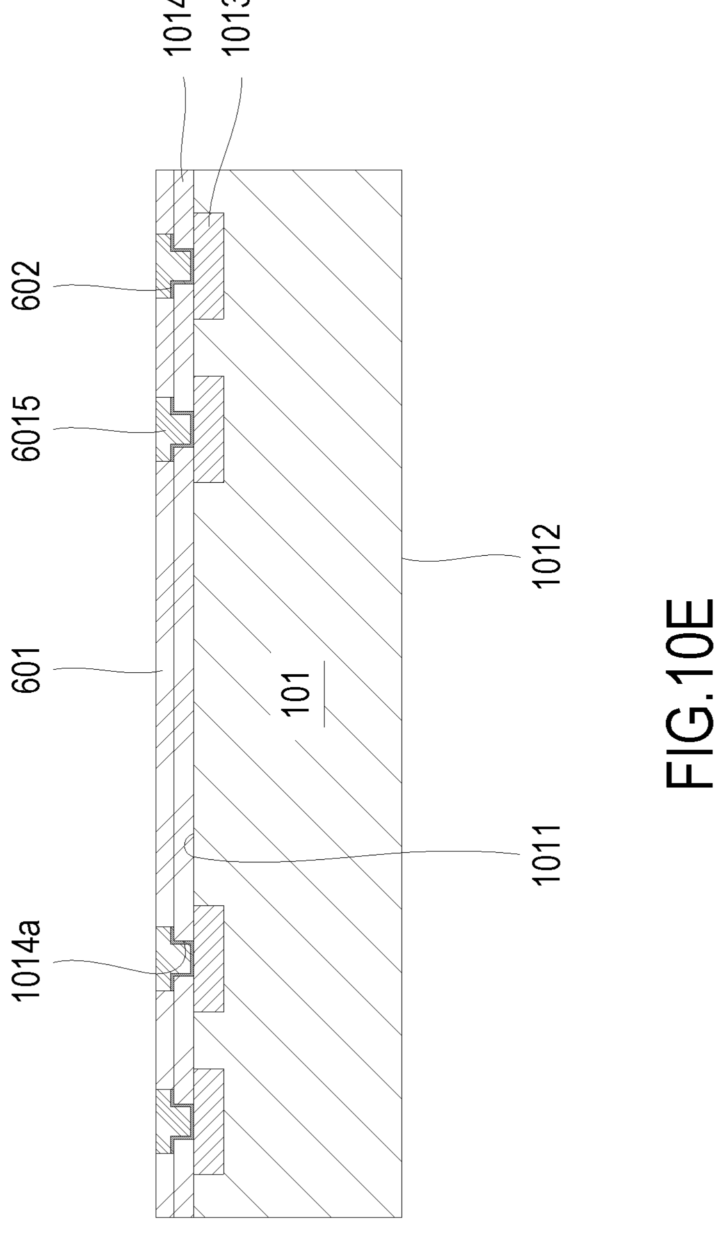

FIG. 10E shows a cross section view of electronic device 60 at a later stage of manufacture. In the process of manufacture shown in FIG. 10E, the top portion of component dielectric 601 can be removed, and the upper sides of component interconnects 6015 can be exposed through component dielectric 601. The top portion of component dielectric 601 and the upper sides of component interconnects 6015 can be coplanar. In some examples, the top portion of component dielectric 601 can be removed by grinding until the upper sides of component interconnects 6015 are exposed. In some examples, the thicknesses of component interconnects 6015 can be similar to the sum of the thicknesses of component dielectric 601 and component dielectric 1014.

Figure 10F:
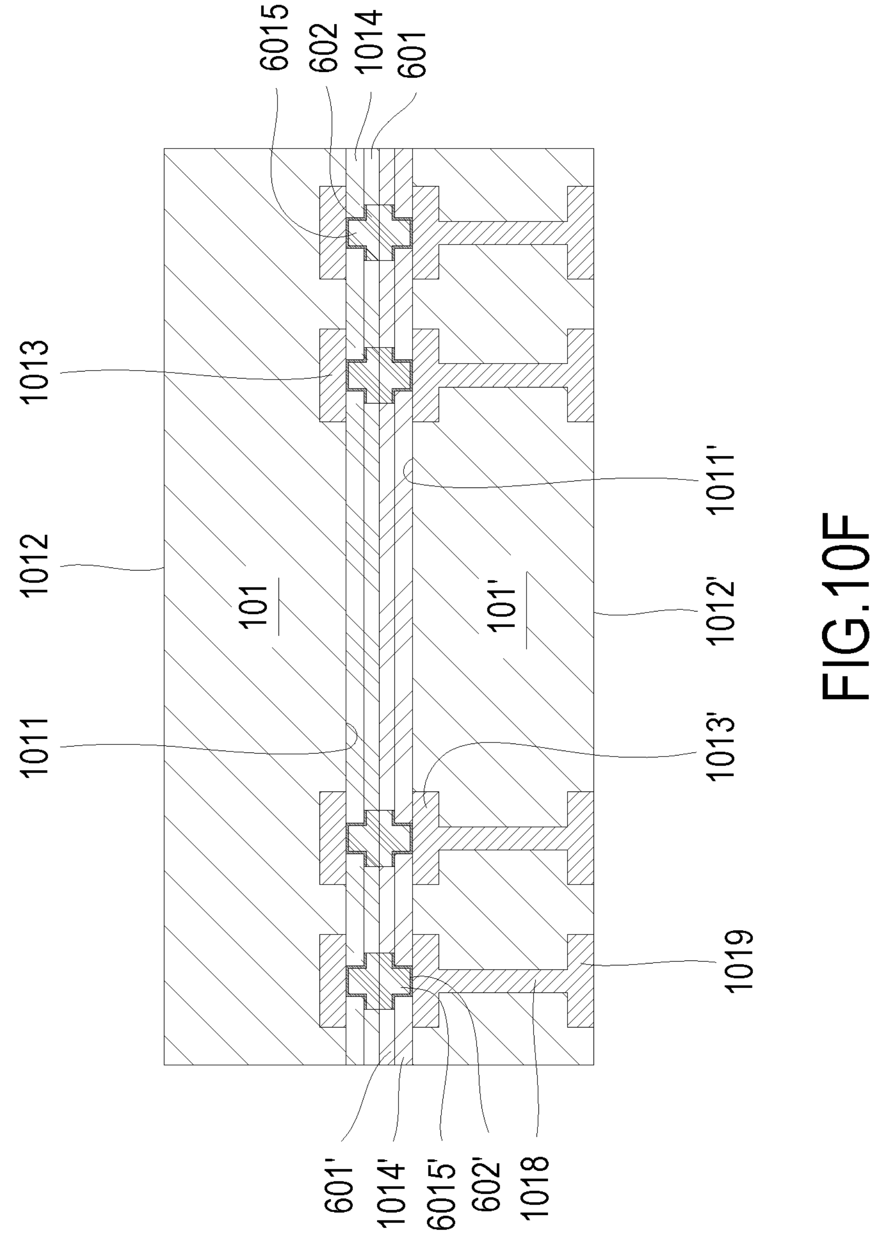

FIG. 10F shows a cross section view of electronic device 60 at a later stage of manufacture. In the process of manufacture shown in FIG. 10F, component dielectric 601 of electronic component 101 can be bonded to component dielectric 601' of electronic component 101', and component interconnects 6015 of electronic component 101 can be bonded to component interconnects 6015' of electronic component 101'. In some examples, electronic component 101' can include corresponding elements, features, materials, or manufacturing method similar to previously described for electronic component 101 manufactured by the manufacturing method shown in FIGS. 10A to 10E. Electronic component 101' can comprise vertical interconnects 1018 and back conductive layer 1019. Vertical interconnects 1018 and back conductive layer 1019 can be similar to corresponding elements of electronic component 101' of electronic device 10 shown in FIG. 2D. In some examples, the bonding method between component dielectric 601 of electronic component 101 and component dielectric 601' of electronic component 101' and the bonding method between component interconnects 6015 of electronic component 101 and component interconnects 6015' of electronic component 101' can be similar to the bonding method for electronic device 10 shown in FIG. 2D.

Figure 10G:
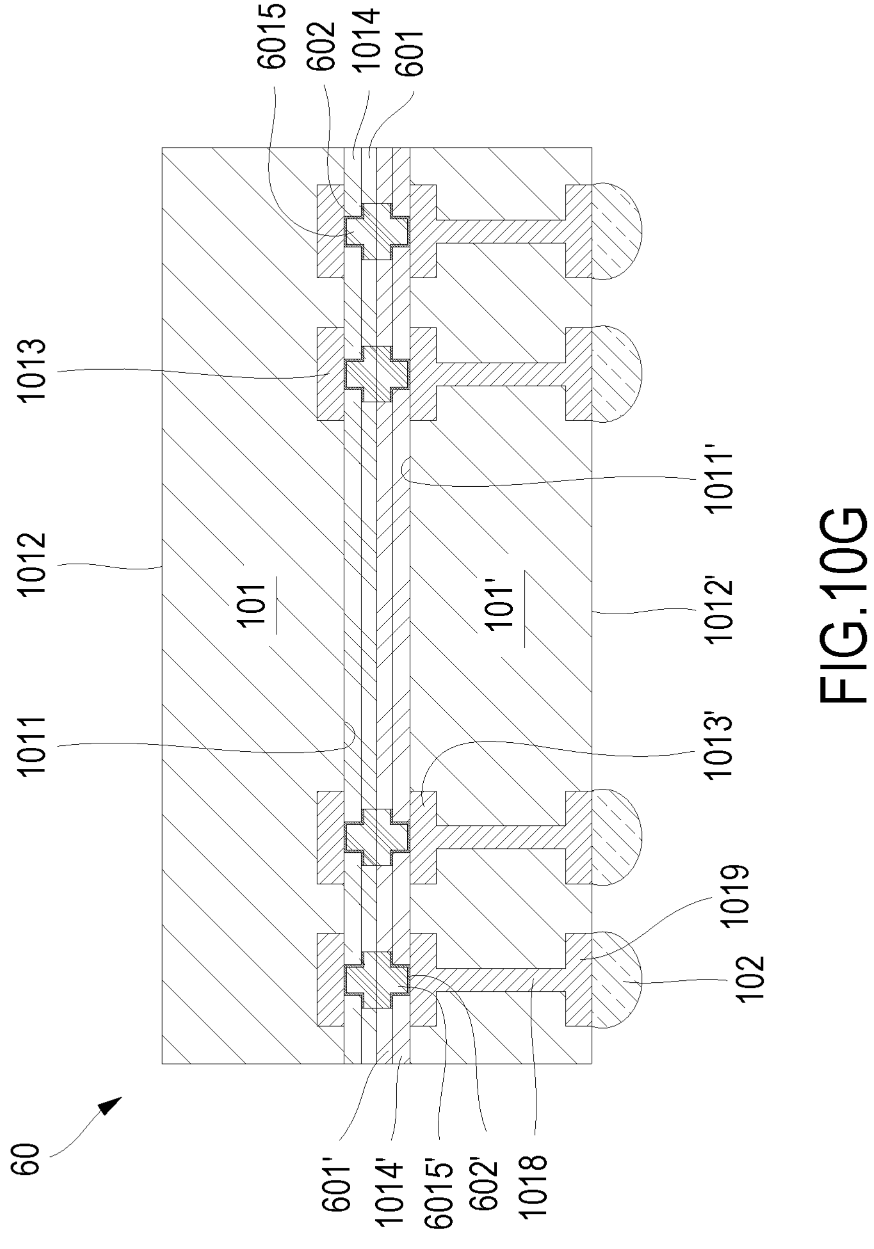

FIG. 10G shows a cross section view of electronic device 60 at a later stage of manufacture. In the process of manufacture shown in FIG. 10G, external interconnects 102 can be coupled to back conductive layer 1019 of electronic component 101'. The method for providing external interconnects 102 can be similar to the method for providing external interconnects 102 of electronic device 10 shown in FIG. 2E.

Figure 11:
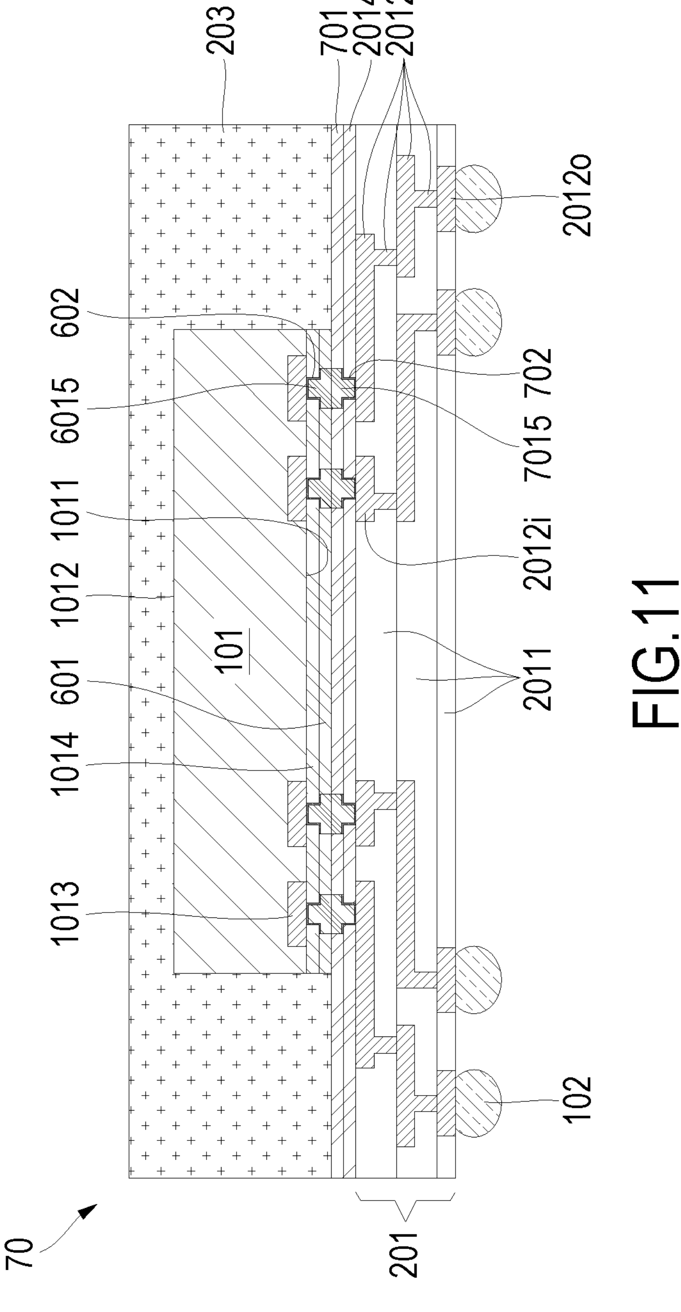
FIG. 11 shows a cross-sectional view of an example electronic device.

FIG. 11 shows a cross-sectional view of an example electronic device 70. In the example shown in FIG. 11, electronic device 70 can comprise electronic component 101, external interconnects 102, substrate 201, and encapsulant 203.

In the present example, electronic component 101 and external interconnects 102 can be similar to electronic component 101 and external interconnects 102 of electronic device 60 previously described. For example, electronic device 70 can be similar to electronic device 60 in terms of component dielectrics 601 and 1014, component bond pads 1013, and component interconnects 6015 in of electronic component 101. In the present example, substrate 201 and encapsulant 203 can be similar to substrate 201 and encapsulant 203 of electronic device 10 previously described. For example, dielectric structure 2011, conductive structure 2012, and substrate dielectric layer 2014 of substrate 201 can be similar to corresponding elements of electronic device 20. In the present example, substrate 210 can comprise substrate dielectric layer 702 interposed between substrate dielectric layer 2014 and encapsulant 203 and between substrate dielectric layer 2014 and component dielectric 601. Substrate dielectric layer 702 can include corresponding elements, features, materials, or manufacturing method similar to previously described for component dielectric 602 of electronic device 60.

In the present example, substrate interconnects 7015 coupling component interconnects 6015 and inner terminals 2012*i* of substrate 210 while penetrating substrate dielectric layers 701 and 2014 can be included. Substrate interconnects 7015 can include corresponding elements, features, materials, or manufacturing method similar to previously described for component interconnects 6015 of electronic device 60.

Figure 12:
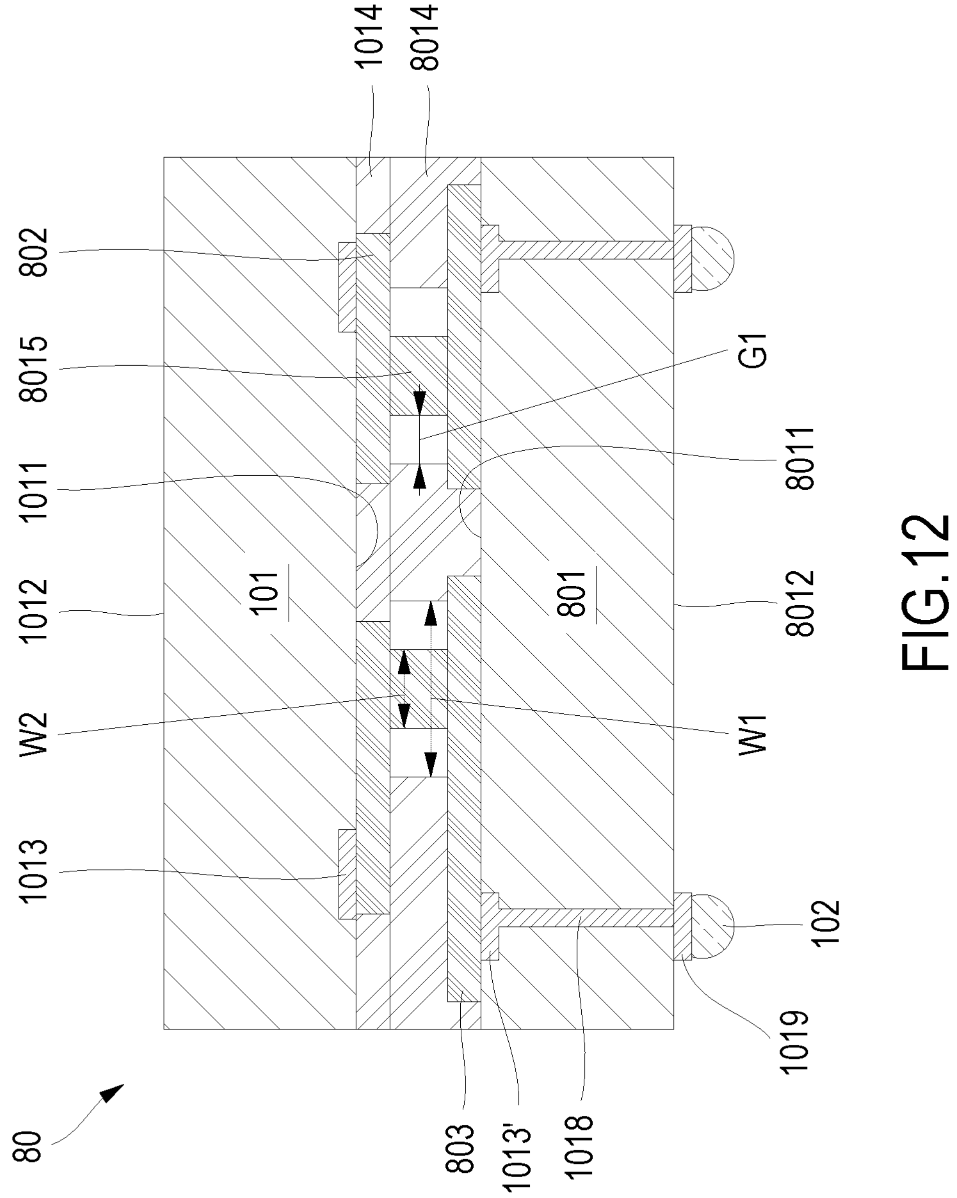
FIG. 12 shows a cross-sectional view of an example electronic device.

FIG. 12 shows a cross-sectional view of an example electronic device 80. In the example shown in FIG. 12, electronic device 80 can comprise electronic components 101 and 801', external interconnects 102, and component redistribution elements 802 and 803. In some examples, redistribution elements 802 and 803 can be referred to as component interconnects.

In the present example, electronic device 80 can be similar to electronic device 10 previously described in terms of electronic component 101 and external interconnects 102. For example, component bond pads 1013 and component dielectric 101 of electronic component 101 of electronic device 80 can be similar to corresponding elements of electronic device 10. For example, in electronic component 101' of electronic device 80, component bond pads 1013', vertical interconnects 1018, and back conductive layer 1019 can be similar to corresponding elements of electronic device 10. In the present example, electronic component 101 of electronic device 80 can comprise component interconnects 8015.

Figure 13A:
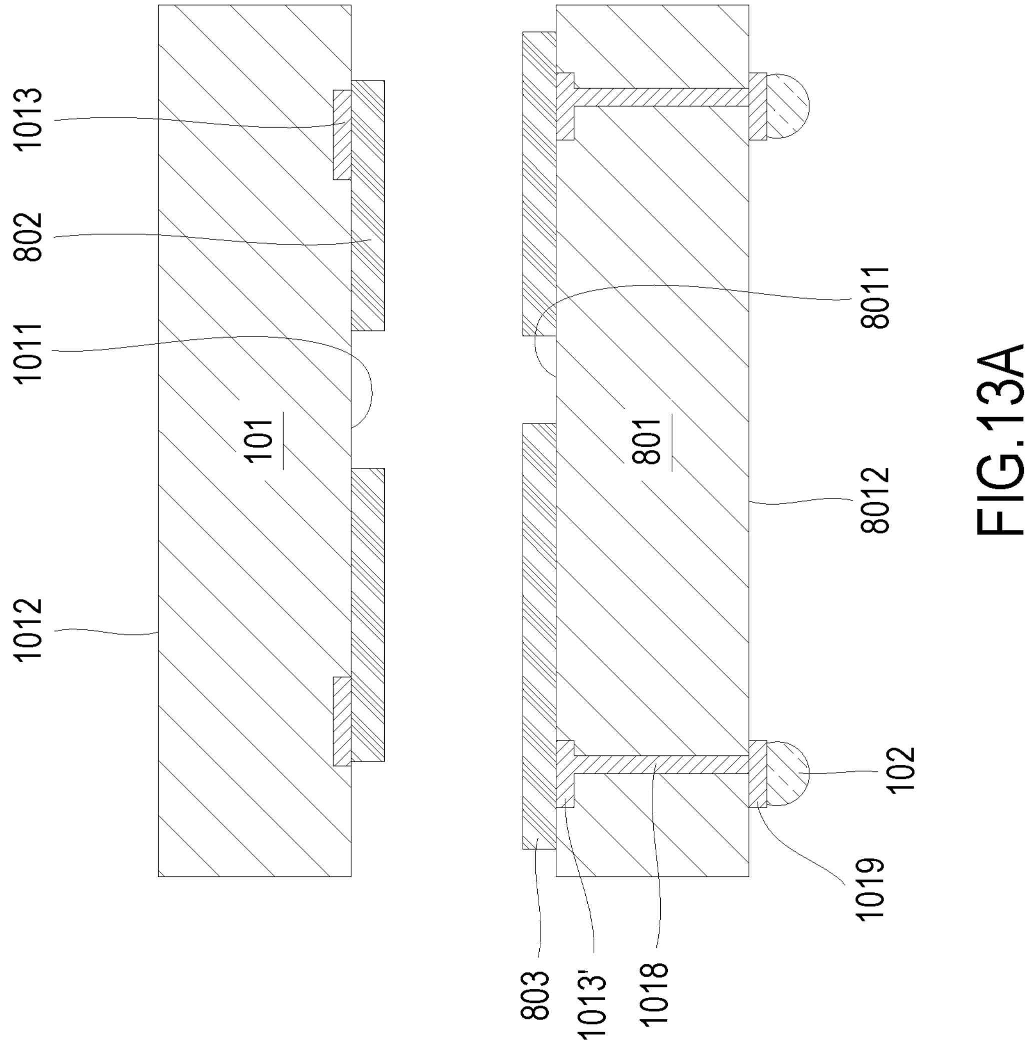
FIGS. 13A-13F show cross-sectional views of an example method for manufacturing an example electronic device.

FIGS. 13A to 13F show cross-sectional views of an example method for manufacturing an example electronic device. FIG. 13A shows a cross section view of electronic device 80 at an early stage of manufacture. In the process of manufacture shown in FIG. 13A, component redistribution element 802 can be provided to component inner side 1011 of electronic component 101, and component redistribution element 803 can be provided to component inner side 8011' of electronic component 801.

Component redistribution elements 802 and 803 can be provided to component inner sides 1011 and 8011 to have multiple patterns, respectively. Component redistribution elements 802 and 803 having multiple patterns can expose component inner sides 1011 and 8011 of electronic components 101 and 801. Component redistribution elements 802 and 803 can be in contact with to component bond pads 1013 and 1013', respectively. Component redistribution elements 802 and 803 coupled to component bond pads 1013 and 1013', respectively, can extend along component inner sides 1011 and 8011. In some examples, component redistribution elements 802 or 803 can comprise or be referred to as a conductor, a conductive material, a redistribution layer, a substrate land, a conductive land, a substrate pad, a wiring pad, a connection pad, a micro pad, a trace or under-bump-metallurgy (UBM). In some examples, component redistribution elements 802 or 803 can comprise copper, iron, nickel, gold, silver, palladium, or tin. In some examples, the thicknesses of component redistribution elements 802 or 803 can range from approximately 10 μm to 100 μm.

Component redistribution element 802 can be included in electronic component 101, and component redistribution element 803 can be included in electronic component 801. Although external interconnects 102 are illustrated as being connected to back conductive layer 1019 of electronic component 801, external interconnects 102 can be provided after hybrid bonding between electronic component 101 and electronic component 801 is performed.

Figure 13B:
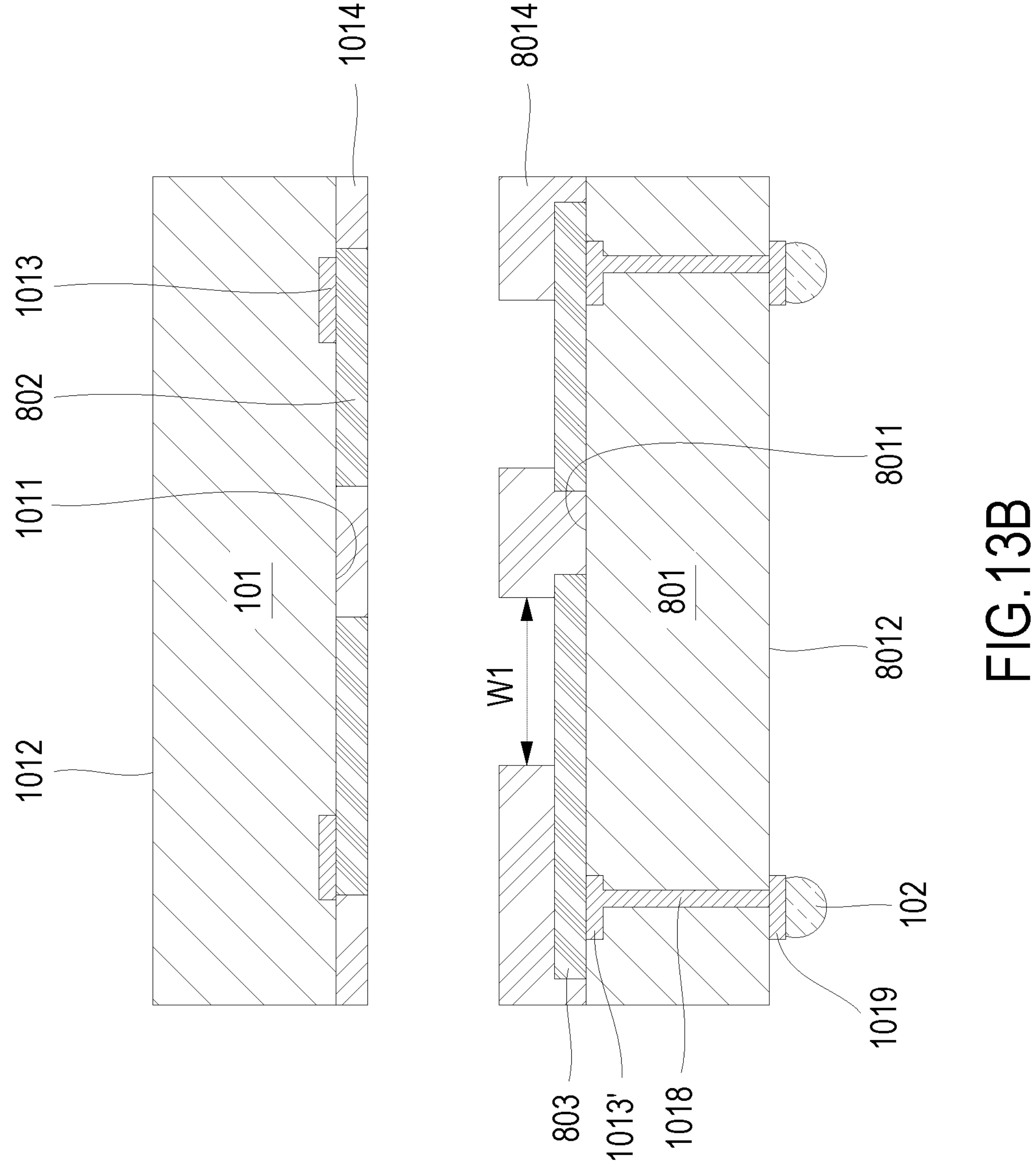

FIG. 13B shows a cross section view of electronic device 80 at a later stage of manufacture. In the process of manufacture shown in FIG. 13B, component dielectric 1014 can be provided to component inner side 1011 of electronic component 101, and component dielectric 8014 can be provided to component inner side 8011 of electronic component 801.

Component dielectric 1014 of electronic component 101 can be interposed between multiple component redistribution elements 802 spaced apart from each other. The thickness of component dielectric 1014 can be similar to component redistribution element 802. The lower side of component dielectric 1014 and the lower side of component redistribution element 802 can be coplanar.

Component dielectric 8014 of electronic component 801 can be interposed between multiple component redistribution elements 803 spaced apart from each other. Component dielectric 8014 can extend to the upper side of component redistribution element 803. The thickness of component dielectric 8014 can be greater than component redistribution element 803. Component dielectric 8014 can protrude upwards relative to component redistribution element 803. Component dielectric 8014 can comprise apertures exposing some portions of multiple component redistribution elements 803 spaced apart from each other. Component dielectric 8014 and apertures of component dielectric 8014 can include corresponding elements, features, materials, or manufacturing method similar to previously described for component dielectric 1014 and apertures 1014*a* of electronic device 60. In some examples, the thickness of component dielectric 8014 can range from approximately 20 μm to approximately 120 μm. Component dielectric 1014 can be included in electronic component 101, and component dielectric 8014 can be included in electronic component 801.

Figure 13C:
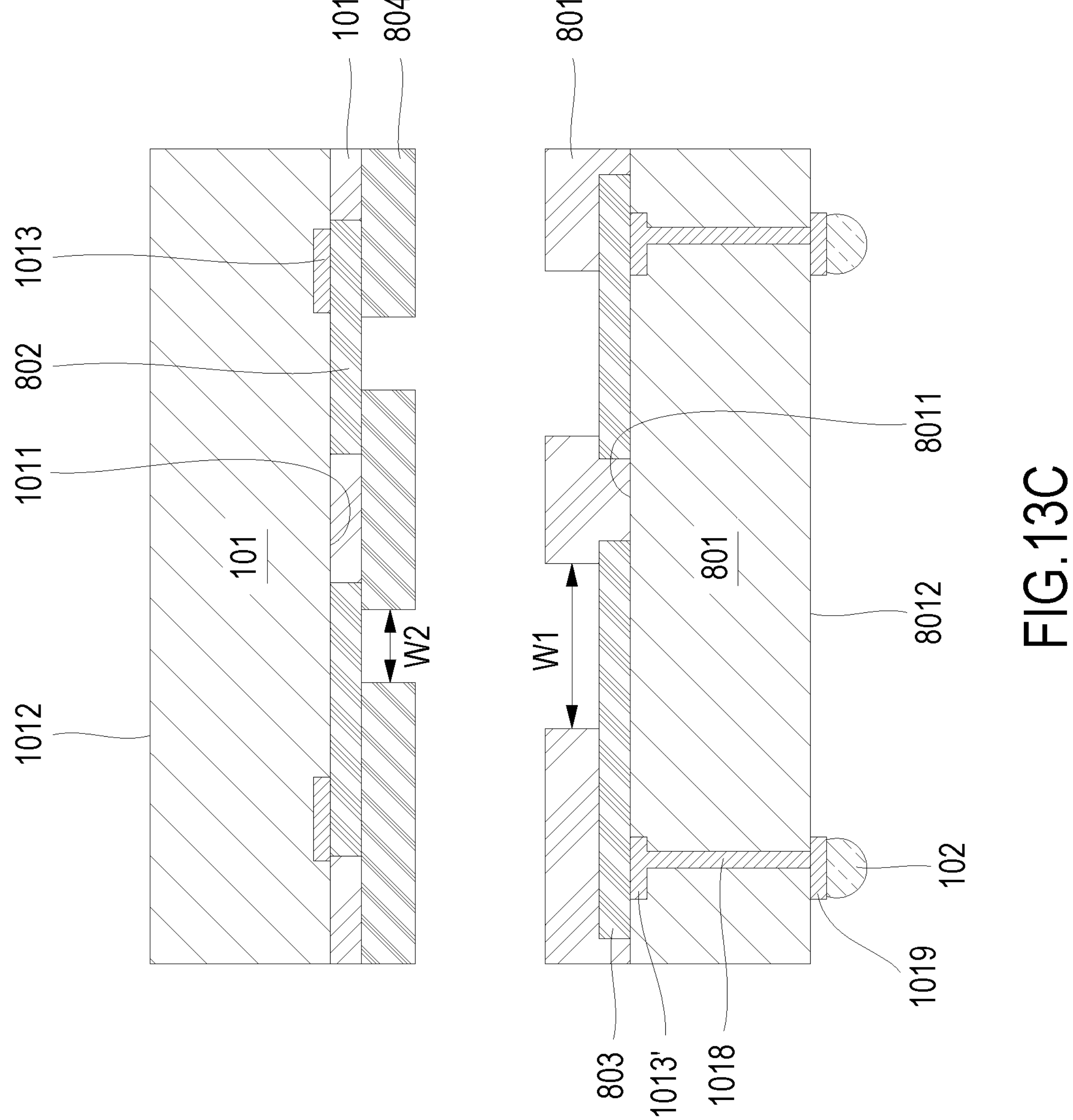

FIG. 13C shows a cross section view of electronic device 80 at a later stage of manufacture. In the process of manufacture shown in FIG. 13C, photoresist 804 can be provided to cover component dielectric 1014 of electronic component 101 and component redistribution element 802. For example, photoresist 804 can be provided to entirely cover component dielectric 1014 and component redistribution element 802, and can then expose portions of component redistribution element 802 having multiple patterns by etching. Photoresist 804 can comprise apertures exposing component redistribution element 802. An aperture width W2 of photoresist 804 can be smaller than an aperture width W1 of component dielectric 8014. Apertures of photoresist 804 can be provided at locations corresponding to apertures of component dielectric 8014. The apertures of photoresist 804 can be located above the apertures of component dielectric 8014.

Figure 13D:
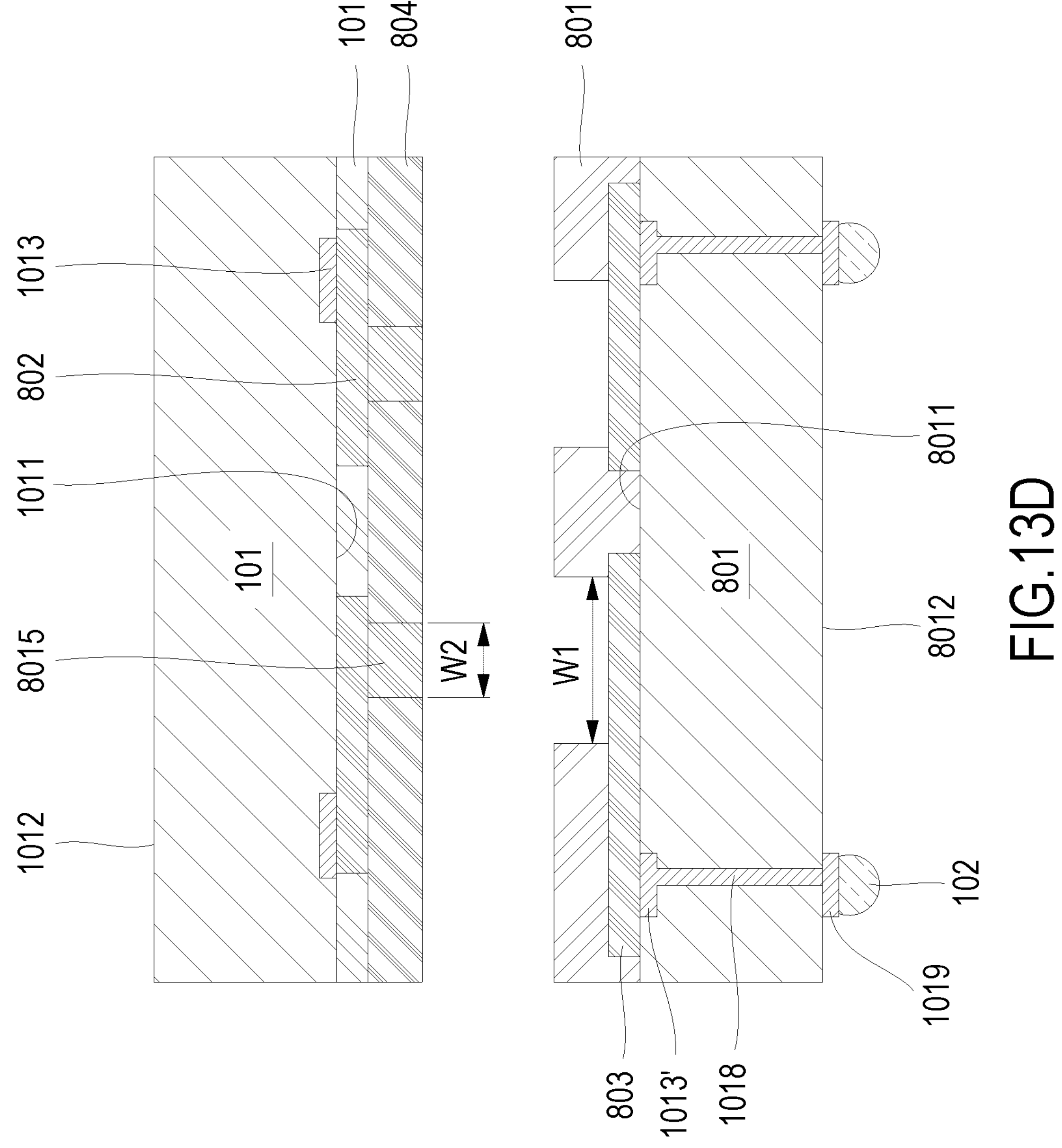

FIG. 13D shows a cross section view of electronic device 80 at a later stage of manufacture. In the process of manufacture shown in FIG. 13D, component interconnects 8015 can be provided at the lower side of component redistribution element 802 of electronic component 101. Component interconnects 8015 can be provided to fill the apertures of photoresist 804. An interconnect width W2 of component interconnects 8015 can be similar to the aperture width W2 of photoresist 804.

Component interconnects 8015 can include corresponding elements, features, materials, or manufacturing method similar to previously described for interconnect first-portions 1016 of electronic device 10 shown in FIG. 1. The thickness of component interconnects 8015 can be similar to a thickness difference between component dielectric 8014 and component redistribution element 803 of electronic component 801.

Figure 13E:
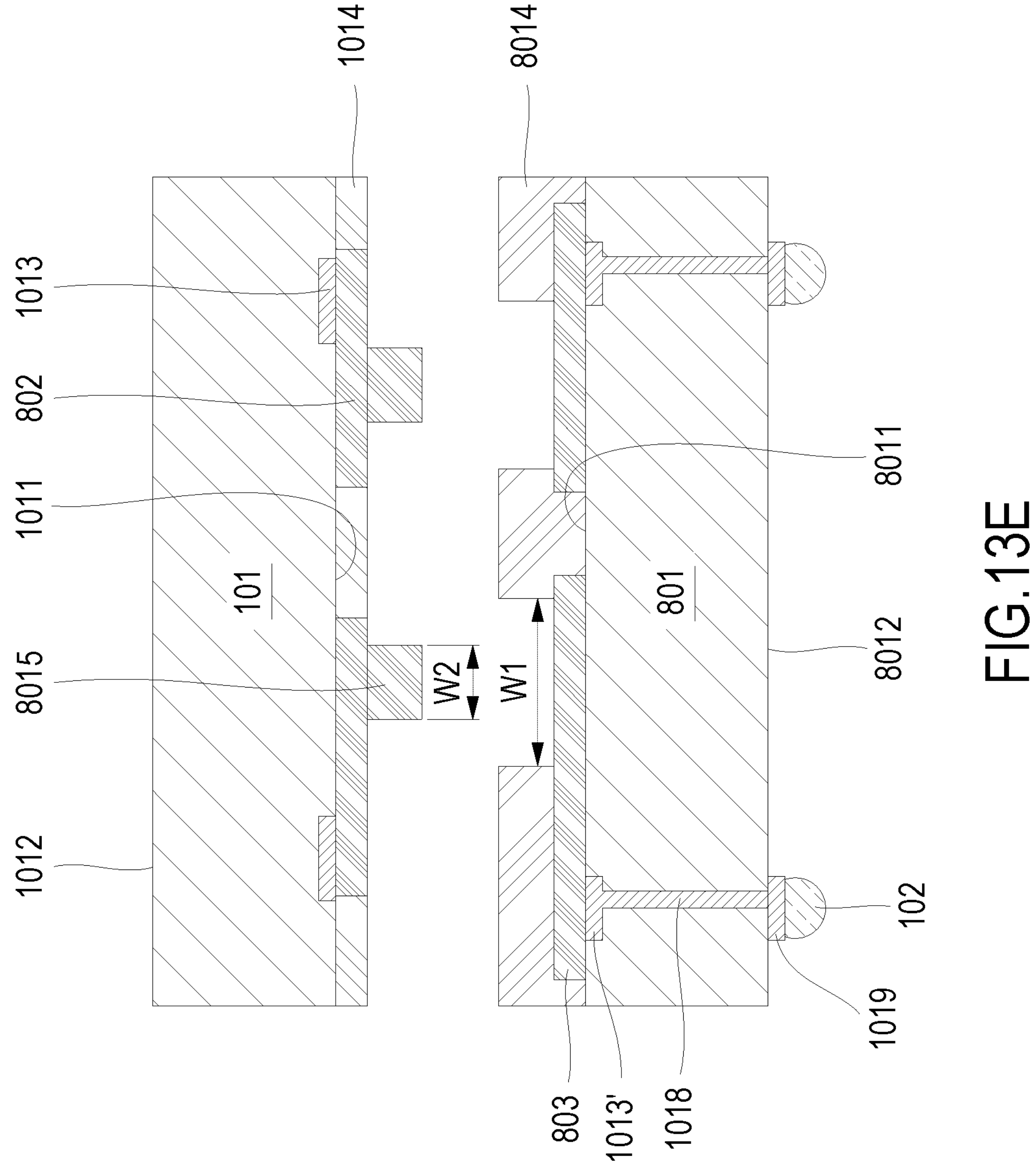

As shown in FIG. 13E after component interconnects 8015 are provided, photoresist 804 can be removed. The upper side of component dielectric 1014, and the upper side of component dielectric 8014 of electronic component 801, can be activated, such as by hydroxyl groups.

Figure 13F:
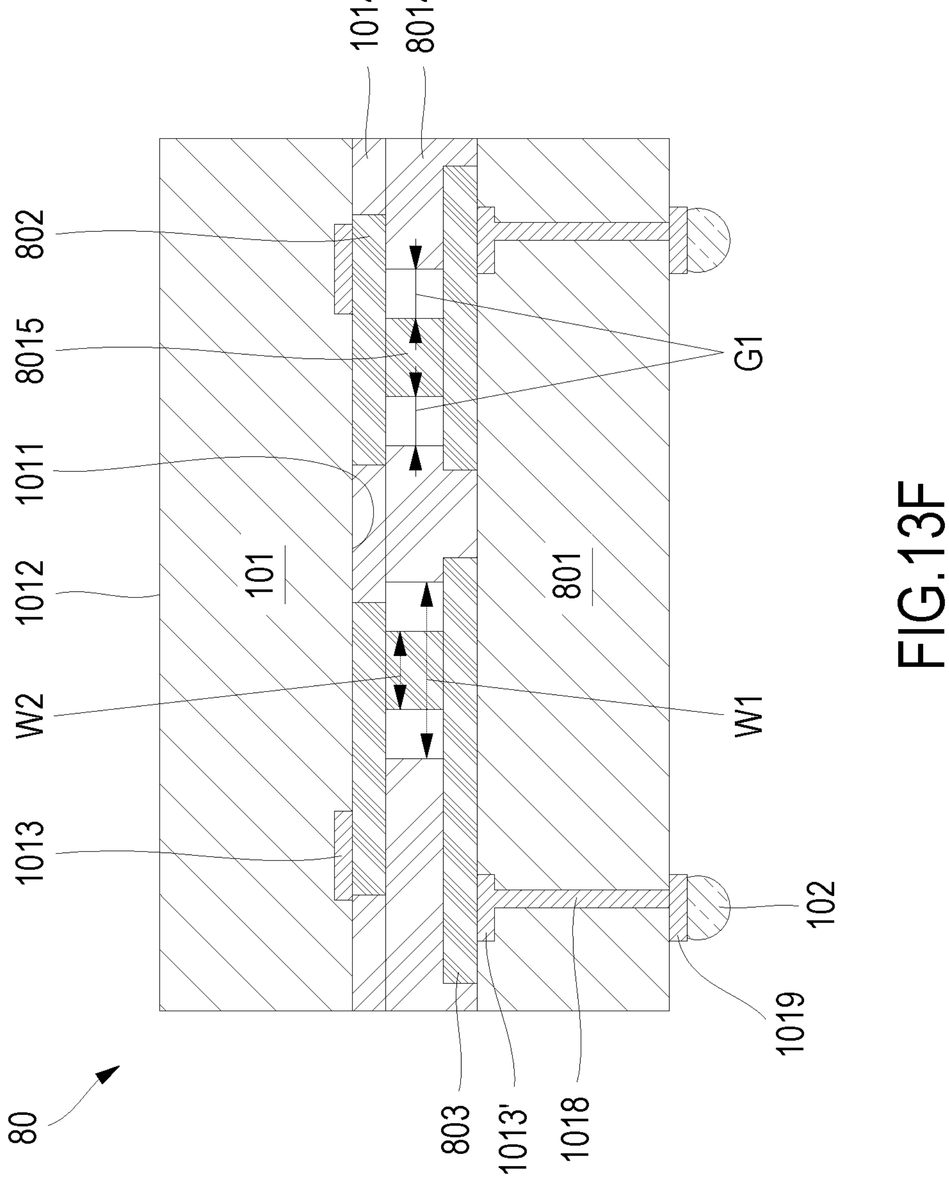

FIG. 13F shows a cross section view of electronic device 80 at a later stage of manufacture. In the process of manufacture shown in FIG. 13F, component dielectric 1014 of electronic component 101 and component dielectric 8014 of electronic component 801 can be bonded to each other, and component interconnects 8015 of electronic component 101 and component redistribution 803 of electronic component 801 can be bonded to each other. Component interconnects 8015 can be in contact with and electrically connected to component redistribution layer 803 while penetrating component dielectric 8014 through the apertures of component dielectric 8014. Since the aperture width (W1) is greater than the interconnect width (W2), the sidewalls, or lateral sides, of component interconnects 8015 can be spaced apart from the inner wall of component dielectric 8014. There can be a gap (G1) between the sidewalls, or lateral sides, of component interconnects 8015 and the inner wall of component dielectric 8014. In some examples, the gap (G1) can comprise or be referred to as an air gap, a space, or a void between the sidewalls, or lateral sides, of component interconnects 8015 and the inner wall of component dielectric 8014. In some examples, a portion of redistribution element 803 is uncovered by component interconnect 8015 and is exposed at gap G1.

The bonding method between component dielectric 1014 of electronic component 101 and component dielectric 8014 of electronic component 801 and the bonding method between component interconnects 8015 of electronic component 101 and component redistribution layer 803 of electronic component 801 can be similar to the bonding method for electronic device 10 shown in FIG. 2D. In electronic device 80, electronic component 101 and electronic component 801 can be electrically connected to each other by one component interconnect 8015, thereby reducing the overall thickness. Since electronic device 80 has the gap (G1), minor misalignment produced when electronic component 101 and electronic component 801 are aligned and then bonded to each other can be solved. Electronic device 80 has relative dielectric constant of air (1.00059) due to the gap (G1), component interconnects 8015 can be prevented from being dispersed to the gap (G1). An increase in contact resistance between component interconnects 8015 of electronic component 101 and component redistribution layer 803 of electronic component 801 can be prevented. In electronic element 80, the relative dielectric constant of gap 80 can be similar to that of air (1.00059). The relative dielectric constant of gap 80 can be higher than that of component dielectric 8014. Electronic device 80 can be provided with gap 80 outside component interconnects 8015 to facilitate signal interference between adjacent component interconnects 8015.

Figure 14:
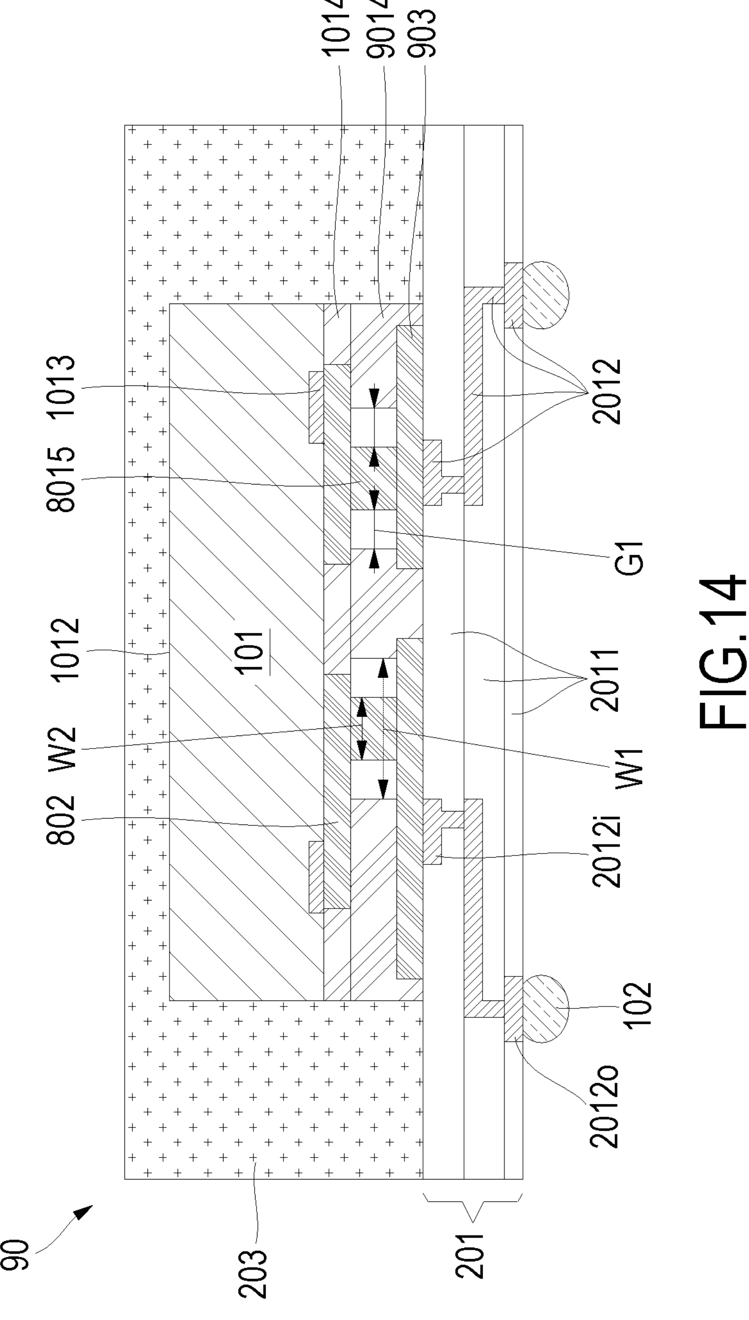
FIG. 14 shows a cross-sectional view of an example electronic device.

FIG. 14 shows a cross-sectional view of an example electronic device 90. In the example shown in FIG. 14, electronic device 90 can comprise electronic component 101, external interconnects 102, substrate 201, and encapsulant 203.

In the present example, electronic component 101 and external interconnects 102 can be similar to electronic component 101 and external interconnects 102 of electronic device 80 previously described. For example, in electronic component 101 of electronic device 90, component dielectric 1014, component bond pads 1013, and component interconnects 8015 can be similar to those of electronic device 80. In the present example, substrate 201 and encapsulant 203 can be similar to substrate 201 and encapsulant 203 of electronic device 20 previously described. For example, dielectric structure 2011 and conductive structure 2012 of substrate 201 can be similar to corresponding elements of electronic device 20. In the present example, substrate 210 can comprise substrate dielectric layer 9014 and substrate redistribution element 903. Substrate dielectric layer 9014 can include corresponding elements, features, materials, or manufacturing methods, similar to component dielectric 8014 of electronic device 80. Substrate redistribution element 903 can include corresponding elements, features, materials, or manufacturing methods, similar to component redistribution layer 803 of electronic device 80.

The present disclosure includes reference to certain examples. It will be understood by those skilled in the art, however, that various changes can be made, and equivalents can be substituted, without departing from the scope of the disclosure. In addition, modifications can be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:

a first component comprising:

a first component inner side and a first component backside;

a first component inner terminal;

a first component dielectric at the first component inner side; and a first component interconnect coupled with the first component inner terminal; and a second component over the first component and comprising:

a second component inner side facing the first component inner side, and a second component backside;

a second component inner terminal;

a second component dielectric at the second component inner side; and a second component interconnect coupled with the second component inner terminal;

wherein:

the first component dielectric and the second component dielectric comprise an inorganic material;

the first component dielectric is coupled with the second component dielectric;

the first component interconnect is coupled with the second component interconnect;

the first component dielectric is above the first component inner side and a portion of the first component inner terminal is external to the first component dielectric; and the second component dielectric is below the second component inner side and a portion of the second component inner terminal is external to the second component dielectric.

2. The electronic device of claim 1, wherein:

the second component comprises a semiconductor chip; and the second component comprises a second component encapsulant contacting a lateral side of the semiconductor chip.

3. The electronic device of claim 2, wherein:

the first component dielectric extends beyond a perimeter of the second component dielectric; and the second component encapsulant contacts a top side of the first component dielectric.

4. The electronic device of claim 1, wherein:

the first component comprises a semiconductor chip; and the first component comprises a vertical interconnect coupled with first component inner terminal and extended through first component.

5. The electronic device of claim 1, wherein:

the first component comprises a first redistribution structure (RDS) dielectric structure and a first RDS conductive structure;

wherein the first RDS dielectric structure is exposed at the first component backside.

6. The electronic device of claim 1, wherein:

the first component comprises a first redistribution structure (RDS) between the first component inner side and the first component dielectric;

the first RDS comprises a first RDS dielectric structure and a first RDS conductive structure; and the first RDS dielectric structure comprises an organic material.

7. The electronic device of claim 6, wherein:

the first RDS conductive structure comprises a first outer terminal; and the first component dielectric covers a lateral side of the first outer terminal.

8. The electronic device of claim 1, wherein:

the first component interconnect comprises a first interconnect first-portion and a first interconnect second-portion;

the second component interconnect comprises a second interconnect first-portion and a second interconnect second-portion;

the first interconnect first-portion and the first interconnect second-portion comprise different materials; and the second interconnect first-portion and the second interconnect second-portion comprise different materials.

9. The electronic device of claim 8, wherein:

the first interconnect first-portion and the second interconnect first-portion comprise copper posts; and the first interconnect second-portion and the second interconnect second-portion comprise solder, tin, or a low melting-point material.

10. The electronic device of claim 1, comprising:

a first insulating structure between the first component inner side and the first component dielectric;

wherein the first insulating structure comprises an organic layer.

11. The electronic device of claim 10, wherein:

the organic layer contacts a lateral side of the first component interconnect.

12. The electronic device of claim 1, wherein:

the first component interconnect comprises a first portion and a second portion comprising a first plating;

the second component interconnect comprises a first portion and a second portion comprising a second plating; and the first plating contacts the second plating.

13. The electronic device of claim 1, wherein:

the inorganic material of the first component dielectric comprises a first nitride layer;

the inorganic material of the second component dielectric comprises a second nitride layer;

the first nitride layer contacts the second nitride layer; and the first component interconnect and the second component interconnect comprise tin or a tin alloy.

14. The electronic device of claim 1, wherein:

the inorganic material of the first component dielectric comprises a first oxide layer;

the inorganic material of the second component dielectric comprises a second oxide layer;

the first oxide layer contacts the second oxide layer; and the first component interconnect and the second component interconnect comprise tin or a tin alloy.

15. The electronic device of claim 1, wherein:

the inorganic material of the first component dielectric comprises a first oxide layer and a first nitride layer; and the inorganic material of the second component dielectric comprises a second oxide layer and a second nitride layer.

16. The electronic device of claim 1, wherein:

the first component dielectric comprises an aperture between a first sidewall of the first component dielectric and a second sidewall of the first component dielectric;

a width of the aperture is greater than a width of the second component interconnect; and a gap is between the first sidewall of the first component dielectric and the second component interconnect.

17. The electronic device of claim 16, wherein:

a portion of the first component interconnect is uncovered by the second component interconnect and is exposed at the gap.

18. The electronic device of claim 1, wherein:

a portion of the first component interconnect has a first width;

a portion of the second component interconnect has a second width; and the first width is greater than the second width.

* * * * *